US009344060B2

(12) United States Patent
Dedic et al.

(10) Patent No.: US 9,344,060 B2
(45) Date of Patent: May 17, 2016

(54) SIGNAL-ALIGNMENT CIRCUITRY AND METHODS

(71) Applicant: SOCIONEXT INC., Yokohama-shi, Kanagawa (JP)

(72) Inventors: Ian Juso Dedic, Northolt Middlesex (GB); Gavin Lambertus Allen, Seabird Western (AU)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/473,630

(22) Filed: Aug. 29, 2014

(65) Prior Publication Data

US 2015/0070065 A1   Mar. 12, 2015

(30) Foreign Application Priority Data

Sep. 12, 2013 (EP) .................................... 13184050

(51) Int. Cl.

| | |
|---|---|
| *H03K 5/13* | (2014.01) |
| *H03H 17/08* | (2006.01) |
| *H03M 1/06* | (2006.01) |
| *G06F 1/04* | (2006.01) |
| *H03B 27/00* | (2006.01) |
| *H03K 5/15* | (2006.01) |

(Continued)

(52) U.S. Cl.
CPC .................. *H03H 17/08* (2013.01); *G06F 1/04* (2013.01); *G06F 1/12* (2013.01); *H03B 27/00* (2013.01); *H03K 5/135* (2013.01); *H03K 5/1502* (2013.01); *H03M 1/0624* (2013.01); *H03H 2218/04* (2013.01); *H03H 2218/12* (2013.01)

(58) Field of Classification Search
CPC ...................................................... H03B 27/00
See application file for complete search history.

(56) References Cited

U.S. PATENT DOCUMENTS

| | | |
|---|---|---|
| 6,622,255 B1 | 9/2003 | Kurd et al. |
| 2003/0117200 A1 | 6/2003 | Koh et al. |
| 2005/0215223 A1 | 9/2005 | Lin et al. |

(Continued)

FOREIGN PATENT DOCUMENTS

| | | | |
|---|---|---|---|
| EP | 1 202 459 B1 | 5/2006 |
| EP | 1 292 035 B1 | 10/2006 |

(Continued)

OTHER PUBLICATIONS

Extended Search Report issued in European Patent Application No. 13184050.6, dated Mar. 3, 2014, 8 pages.

*Primary Examiner* — Daniel Puentes
(74) *Attorney, Agent, or Firm* — Arent Fox LLP

(57) ABSTRACT

Signal-alignment circuitry, comprising: phase-rotation circuitry connected to receive one or more input clock signals and operable to generate therefrom one or more output clock signals; and control circuitry operable to control the amount of phase rotation applied by the phase-rotation circuitry to carry out a plurality of alignment operations, the alignment operations comprising: one or more first operations each comprising rotating one or more of said output clock signals relative to one or more of the other said output clock signals, to bring a phase relationship between said output clock signals, or clock signals derived therefrom, towards or into a given phase relationship; and one or more second operations each comprising rotating all of said output clock signals together, to bring a phase relationship between said output or derived clock signals and said input clock signals or an external-reference signal towards or into a given phase relationship.

21 Claims, 12 Drawing Sheets

(51) Int. Cl.
*H03K 5/135* (2006.01)
*G06F 1/12* (2006.01)

(56) References Cited

U.S. PATENT DOCUMENTS

| | | |
|---|---|---|
| 2006/0208811 A1 | 9/2006 | Lee |
| 2009/0179674 A1* | 7/2009 | Tamura et al. ............... 327/155 |
| 2012/0194229 A1* | 8/2012 | Velayuthan ................ 327/118 |
| 2013/0135016 A1 | 5/2013 | Leung et al. |

FOREIGN PATENT DOCUMENTS

| | | |
|---|---|---|
| EP | 2 019 486 A1 | 1/2009 |
| EP | 2 019 490 A1 | 1/2009 |
| EP | 2 009 795 B1 | 6/2010 |
| EP | 2 019 427 B1 | 9/2010 |
| EP | 2 023 489 B1 | 2/2011 |
| EP | 2 211 468 B1 | 7/2011 |
| EP | 2 019 487 B1 | 5/2013 |
| GB | 2 373 654 B | 2/2005 |

* cited by examiner

SIGNAL-ALIGNMENT CIRCUITRY AND METHODS

CROSS REFERENCE TO RELATED APPLICATIONS

This application claims priority to European Patent Application No 13184050.6, flied Sep. 12, 2013, the disclosure of which is hereby incorporated by reference in its entirety.

The present invention relates to circuitry and methods for aligning signals, for example for aligning clock signals and thereby synchronising the operation of analogue-to-digital converter (ADC) circuitry and digital-to-analogue converter (DAC) circuitry.

By way of introduction, one example application of the circuitry disclosed herein is for the generation, control and alignment of clock signals required by functional units in both DAC and ADC circuitry, which may be implemented on an IC chip.

High-speed DAC and ADC circuitry of the present applicant is typically characterised in that it is necessary to generate and distribute many very-fast clock signals, where the timing of those signals relative to one another and to clock signals in other circuits affects the operation of such functional units and the DAC and ADC circuitry as whole.

FIG. 1 is a schematic diagram showing parts of combined DAC and ADC circuitry 10, as an example of circuitry in which the present invention may be employed. Circuitry 10 comprises ADC circuitry 100 shown on the left-hand side, DAC circuitry 200 shown on the right-hand side, and clock generation and distribution circuitry 300 shown in the middle.

DAC circuitry 200 comprises a switching circuit 210, which comprises clock-controlled circuitry and data-controlled circuitry. Switching circuit 210 is operable based on input data and clock signals to output an analogue signal representative of the input data.

As a running example, a desired DAC sample rate of 64 Gs/s is assumed, with data signals DATA 1 to DATA 4 (corresponding to the four input data signals shown) input to the switching circuit 210 being 16 GHz (i.e. time-interleaved) data signals. The four input clock signals CLK $\phi1$ to CLK $\phi4$ are assume to be four time-interleaved 16 GHz clock signals, which are substantially sinusoidal (raised-cosine signals).

Three stages of multiplexing/retiming 220, 230 and 240 are also shown by way of example, in order to input at the first multiplexer/retiming circuit 240 a parallel set of 64 1 GHz data signals when retiming is carried out (or a parallel set of 128 500 MHz signals, when multiplexing is carried out), and output those as a parallel set of 64 1 GHz data signals to the second multiplexer 230, which in turn outputs 16 4 GHz signals to the third and last multiplexer 220, which in turn outputs the data signals DATA 1 to DATA 4 as 4 16 GHz signals as above.

The data signals may be differential data signals, in which case circuitry 210, 220, 230 and 240 may also be differential circuitry.

The switching circuit 210 is representative of a single segment or "slice" in the overall DAC 200. Thus, any coding (e.g. thermometer-coding) of an ultimate input digital signal is assumed to have occurred upstream of the digital signals input in FIG. 1, such that those input digital signals input are only those intended for the segment or slice shown.

The overall DAC 200 would have further slices or segments, each with their own stages of multiplexing/retiming 220, 230 and 240. The clock generation and distribution circuitry 300 may be shared (at least in part) between the segments (or separately provided, at least in part).

The analogue outputs of the various slices or segments may be combined to create a single analogue output of the overall DAC. For example, seven segments could be provided to produce the outputs for the 3 MSBs of an 8-bit DAC (with thermometer-encoding), and five segments (in which their outputs are binary weighted) could be provided to produce the outputs for the 5 LSBs. Other variations would of course be possible. For example, an impedance ladder could be employed, as disclosed in EP-A1-2019490.

Also shown in clock generation and distribution circuitry 300 is a clock generator 310 configured to generate the clock signals CLK $\phi1$ to CLK $\phi4$ from a reference clock signal REFCLK and supply them to the switching circuit 210. Further, shown are three stages of clock generation 320, 330, 340, in order to take the input clock signals CLK $\phi1$ to CLK $\phi4$ and generate in turn the clock signals (4 GHz and 1 GHz) required by the three stages of multiplexing/retiming 220, 230, 240, as indicated in FIG. 1. Although the clock signals CLK $\phi1$ to CLK $\phi4$ generated by clock generator 310 are sinusoidal, the clock signals generated by the three stages of clock generation 320, 330, 340 need not be, and may be switched-logic signals.

In a similar manner, the ADC circuitry 100 comprises sampler circuitry 110. Again, either single-ended or differential signals could be used.

A similar running example is employed here, i.e. a desired ADC sample rate of 64 Gs/s, and with 2-stages of demultiplexing shown as 120 and 130, each performing 1:4 demultiplexing, and with sub-ADC units 140. The sampler circuitry 110 is configured to take samples from the analogue input at the overall 64 Gs/s sample rate by current steering in current mode, and to output 4 sample streams (single-ended or differential) each at 16 Gs/s (which may be expressed herein as 16 GHz), with the first demultiplexing stage 120 outputting 16 4 Gs/s signals, and with the second demultiplexing stage 130 outputting 64 1 Gs/s signals.

The same clock generation and distribution circuitry 300 (at least, schematically) accordingly provides its clock signals to the ADC circuitry 100, as well as to the DAC circuitry 200. In particular, looking at FIG. 1 and working downwards from the sampler circuitry 110 and switching circuitry 210, in both the DAC and ADC circuitry the signals in successive stages are 4 16 GHz signals, then 16 4 GHz signals, and then 64 1 GHz signals.

To provide some context, for example as to how the clock signals CLK $\phi1$ to CLK $\phi4$ may be employed in FIG. 1, FIGS. 2 to 4 present DAC and ADC circuitry corresponding to the switching circuit 210 and the sampler circuitry 110 in FIG. 1.

FIG. 2 is a schematic view of a differential switching circuit 500, which may form part of the switching circuit 210.

The circuitry 500 comprises a common node CN (or tail node) to which a current source (or, once and for all, sink) is connected. Four transistors SW1 to SW4 are shown connected in parallel (in parallel branches) between the common node CN and a first output node A. Similarly, four transistors SW5 to SW8 are shown connected in parallel between the common node CN and a second output node B. These transistors SW1 to SW8 will be referred to as output switches hereafter.

The gates of the output switches SW1 to SW8 are driven directly by way of the clock signals CLK $\phi1$ to CLK $\phi4$ as indicated, although a buffer or coupling capacitor may be provided along the clock paths to the gates (not shown). Data-controlled switches D1 to D8 are provided in series connection with the output switches SW1 to SW8, respectively.

It is advantageous to drive the gates of the output switches directly with clock signals, provided that good control can be had of the signals which arrive at those gates.

Looking at FIG. 2, each output switch SW1 to SW8 effectively is one of a pair of series-connected switches (in this case, field-effect transistors). These switches may be implemented as NMOS field-effect transistors.

The clock signals CLK φ1 to CLK φ4 are substantially sinusoidal in the present example. Effectively, four evenly time-interleaved sinusoidal clock signals are provided.

The overall operation of the FIG. 2 circuitry is that the output switches SW1 to SW8 and the data-controlled switches D1 to D8 are driven so as, in use, to steer current from/of the current source (or sink) through the first output node A or the second output node B in dependence upon the value (digital 0 or 1) of the data signals DATA1 to DATA4, which are shown as being applied to the data-controlled switches D1 to D8.

In order to achieve this, output switches SW1 and SW5 are provided with clock signal CLK φ1, SW2 and SW6 are provided with clock signal CLK φ2, SW3 and SW7 are provided with clock signal CLK φ3, and SW4 and SW8 are provided with clock signal CLK φ4. Moreover, data-controlled switches D1 and D5 are respectively provided with data signals DATA 1 and $\overline{DATA1}$, D2 and D6 are respectively provided with DATA 2 and $\overline{DATA2}$, D3 and D7 are respectively provided with DATA 3 and $\overline{DATA3}$, and D4 and D8 are respectively provided with DATA 4 and $\overline{DATA4}$.

The effect of the 4-phase clock signal is that either output switch SW1 or SW5 carries a current pulse in a first clock cycle or phase (φ1), dependent on the value of the data signal DATA 1. Similarly, dependent on data, SW2 or SW6 carries a current pulse in a second clock cycle or phase (φ2), SW3 or SW7 carries a current pulse in a third clock cycle or phase (φ3) and SW4 or SW8 carries a current pulse in a fourth clock cycle or phase (φ4). The output switches in FIG. 2 are NMOS transistors, and as such turn on in the +ve peak portions of the relevant clock signals.

Accordingly, for each clock cycle, if the value of the data signal concerned is 1 the current $I_{TAIL}$ is steered through node A and if it is zero through node B. Moreover, in each cycle two transistors (of the output switches) turn on and two turn off, irrespective of the data.

Given the example 16 GHz, 4-phase clock signal depicted in FIG. 3, it will be appreciated that this operation leads to the example overall sample rate of 64 Gs/s.

Output nodes A and B are connected to the output switches of the DAC 200 via respective output cascodes as indicated in FIG. 2. A differential output signal of the switching circuitry may thus be measured between the two output terminals, as a current signal or as a voltage signal by way of terminating resistors (not shown).

Looking at each pair of series-connected switches in FIG. 2 as a single unit, in any particular cycle or state 1 is off and 7 are on. Looking at the upper switches (the output switches) of each pair, in any state 2 are on and 6 are off. Looking at the lower switches (the data-controlled switches) of each pair, in any state (ignoring transitional changes of the data values, which in an ideal case would be instantaneous) 4 are on and 4 are off.

Moreover, looking at each pair as a single unit, from one cycle to the next 1 turns on and 1 turns off. Looking at the upper switches (the output switches) of each pair, from one cycle to the next 2 turn on and 2 turn off. Looking at the lower switches (the data-controlled switches) of each pair, from one cycle to the next either the same number turn on as turn off (if the data changes) or the switches retain their states (if the data stays the same).

Looking further at FIG. 2, the circuitry portion comprising output switches SW1 to SW8 may be referred to as clock-controlled circuitry 520, and the circuitry portion comprising data-controlled switches D1 to D8 may be referred to as data-controlled circuitry 540. It will be appreciated that the switches in the clock-controlled circuitry 520 are controlled by clock signals and not by data signals, and as such they may be considered data-independent. Conversely, the switches in the data-controlled circuitry 540 are controlled by data signals and not by clock signals, and as such they may be considered clock-independent. For example, the clock signals CLK φ1 to CLK φ4 may be supplied continuously (i.e. during active operation) to the clock-controlled circuitry 52 and specifically to the gates of the output switches SW1 to SW8 (field-effect transistors).

To demonstrate the importance of the clock signals CLK φ1 to CLK φ4, reference may be made to FIG. 4.

FIG. 4 presents waveforms for the clock signals CLK $\phi_1$ to $\phi_4$ in the upper graph, and partial waveforms for the currents received at output nodes A and B, labelled as $IOUT_A$ and $IOUT_B$, in the lower graph, for use in better understanding the operation of differential switching circuit 500 of FIG. 2.

As mentioned above, clock signals CLK $\phi_1$ to $\phi_4$ are time-interleaved raised (substantially) cosine waveforms and are 90° out of phase with one another. The clock signals shown are sinusoidal, but need not be strictly-perfect sinusoids. As will become apparent, in the present embodiment the shape of the waveforms is more important in the uppermost part than towards the bottom.

As an aside, the number of clock signals shown in FIGS. 3 and 4 is related to the number of parallel paths to each of nodes A and B in FIG. 2. Since there are four parallel paths to each of nodes A and B in FIG. 2, four time-interleaved clock signals are provided, 90° out of phase with one another. It is envisaged that where X parallel paths to each of nodes A and B are provided, X time-interleaved clock signals may be provided, (360/X)° out of phase with one another. In this case, X is an integer greater than or equal to 2, and preferably greater than or equal to 3, and more preferably equal to 4.

Returning to FIG. 4, for the benefit of further explanation clock signal $\phi_4$ is highlighted in bold.

Clock signals CLK $\phi_1$ to $\phi_4$ control the gates of output switches SW1 to SW8, as already described in connection with FIG. 2. Accordingly, the output-switch pairs (where the pairs are SW1/SW5, SW2/SW6, SW3/SW7, SW4/SW8) are turned on and then off in sequence, such that as one of them is turning off the next in sequence is turning on, and such that when one of them is turned fully on the others are substantially turned off. As mentioned before, which switch of such an output-switch pair carries a current pulse when the pair is turned on is dependent on the data signal (of DATA 1 to DATA 4) concerned.

Because substantially all current passing through the common node via switches SW1 to SW8 must equal current $I_{TAIL}$, then the sum of currents flowing through nodes A and B at any time must be substantially equal to $I_{TAIL}$. The effect of the data-controlled switches D1 to D8 mentioned above is therefore that current $I_{TAIL}$ is steered to pass through one switch from each output-switch pair in the sequence in which those output-switch pairs are turned on and off, i.e. such that as one of the output-switch pairs is turning off and thus one of its output switches starts to carry less of $I_{TAIL}$, the next output-switch pair in sequence is turning on and thus one of its output switches starts to carry more of $I_{TAIL}$, and such that when one of the output-switch pairs is turned fully on, one of its output switches carries substantially all of $I_{TAIL}$ because the other output switch of that pair has its series-connected data-controlled switch substantially turned off and because the output switches of the other output-switch pairs are substantially turned off.

This effect is shown in the lower graph of FIG. 4. Only three output currents for clocks CLK $\phi_3$, $\phi_4$ and $\phi_1$ are shown for simplicity, however the pattern of waveforms shown continues with the successive peaks being for $IOUT_A$ or $IOUT_B$ dependent on the data. In the present example, it is assumed that the data sequence is DATA 3=0 (such that the current passes to node B), DATA 4=1 (such that the current passes to node A), and DATA 1=0 (such that the current passes to node B). For comparison with the upper graph of clock signals, the waveform for the output current corresponding to clock signal $\phi_4$ is highlighted in bold.

In order to gain a better understanding of the lower graph in FIG. 4, three points, 600, 620 and 640 are indicated on waveform $\phi_4$ and a corresponding three points 700, 720 and 740 are indicated on the corresponding current waveform.

At point 600, waveform CLK $\phi_4$ is at its peak value, i.e. at $V_{DD}$, and the other clock signals CLK $\phi_1$ to $\phi_3$ are significantly below their peak value. Accordingly, (given DATA 4=1) switches SW4 and SW8 are fully on with D4 on and D8 off, and at least the other output switches (SW1 to SW3 and SW5 to SW7) are substantially off. Therefore, at the corresponding point 700, current $IOUT_A$ is equal to $I_{TAIL}$ and current $IOUT_B$ is substantially equal to zero.

At point 620, which precedes point 600, waveform $\phi_4$ is rising towards its peak value but has not yet reached its peak value. Also, at point 620, waveform $\phi_3$ is falling from its peak value. Importantly, at point 620 clock signals $\phi_3$ and $\phi_4$ have equal values. Therefore switches SW3 and SW4, and also SW7 and SW8 are on to the same extent as one another, because their source terminals are connected together. At point 620, clock signals $\phi_1$ and $\phi_2$ are also equal to one another and are sufficiently low to ensure that switches SW1 and SW2, and also SW5 and SW6, are off. Thus, at this point in time, half of current $I_{TAIL}$ flows through switches SW4 and D4 (given DATA 4=1) and half of it flows through switches SW7 and D7 (given DATA 3=0), as indicated by point 720, such that $IOUT_B=IOUT_A=(I_{TAIL})/2$.

Point 640 is equivalent to point 620, except that at this point it is switches SW4 and SW1, and also SW8 and SW5 that are on. Therefore, at corresponding point 740, $IOUT_A=IOUT_B=(I_{TAIL})/2$.

It will therefore be appreciated that the three points for each current waveform (e.g. points 700, 720 and 740 for current waveform $IOUT_A$ in FIG. 4) are fixed or defined in time relative to the clock waveforms and in magnitude relative to the current $I_{TAIL}$. That is, taking current $IOUT_A$ as an example, at point 700 the current is equal to $I_{TAIL}$ and at points 720 and 740 the current is equal to half $I_{TAIL}$. The location of points 700, 720 and 740 is fixed relative to the clock signals $\phi_1$ to $\phi_4$. The same is true for the subsequent current signal pulses or charge packets, which may be for $IOUT_A$ or $IOUT_B$ dependent on the data. The focus on points 600, 620 and 640 demonstrates that the upper part of the clock signals is important, and that the lower parts are less important (such that, for example, the precise shape of the lower parts is not strictly critical).

Thus, the series of current pulses of waveforms (for $IOUT_A$ or $IOUT_B$ dependent on the data) are all of the same shape, and that shape is defined by the raised cosine shape of the clock signals.

Incidentally, it will be appreciated that in order to determine whether any particular current pulse in the lower half of the Figure is of $IOUT_A$ or $IOUT_B$ the data value concerned should be stable in time to create the pulse concerned. For example, in the case of the bold current signal of FIG. 4, which corresponds to clock signal CLK $\phi_4$, the relevant data signal DATA 4 should be stable at least over the period of time spanning the five vertical dashed lines. For example, data signal DATA 4 could be arranged to change state at or approximately at the troughs (negative peaks) of clock signal CLK $\phi_4$. Similarly, each of data signals DATA 1 to DATA 3 could be arranged to change state at or approximately at the troughs of their respective clock signals CLK $\phi_1$ to $\phi_3$. Thus, in the running example of 16 GHz clock signals as in FIG. 3, the data signals DATA 1 to DATA 4 may also be 16 GHz signals configured to change state at or approximately at the troughs of their respective clock signals.

For the present purposes the point to note is that the accuracy of the clock signals CLK $\phi_1$ to $\phi_4$ directly affects the accuracy of the current pulses in the lower part of FIG. 4, and as a result the accuracy of the overall DAC circuitry. Moreover, it is important that data signals DATA 1 to DATA 4 are provided to the data-controlled switches D1 to D8 with correct timing. The data signals DATA 1 to DATA 4 in FIGS. 2 to 4 correspond to the data signals DATA 1 to DATA 4 input to the switching circuit 210 of FIG. 1, and thus the operation of the stages of multiplexing/retiming 220, 230 and 240 is also time critical.

FIG. 5 presents sampler circuitry 800 which may form part of the sampler circuitry 110 of FIG. 1. FIG. 5 corresponds to FIG. 10 of EP-A1-2211468, to which reference may now be made. In FIG. 5, the point to note is that sampling switches SW1 to SW8 correspond to output switches SW1 to SW8 of FIG. 2, and that clock signals CLK $\phi$1 to $\phi$4 also correspond to clock signals CLK $\phi$1 to $\phi$4 of FIGS. 2 to 4. Moreover, the relative importance of the uppermost parts of the clock signals CLK $\phi$1 to $\phi$4 explained in connection with FIG. 3 also applies to the sampling circuitry 800 of FIG. 5, as explained in FIG. 12 of EP-A1-2211468. A detailed understanding of the sampling circuitry 200 can be found in EP-A1-2211468.

Again, for the present purposes the point to note is that the accuracy of the clock signals CLK $\phi$1 to $\phi_4$ directly affects the accuracy of the current pulses in the lower part of FIG. 4, which applies analogously to the sampling circuitry 800 of FIG. 5, and as a result affects the accuracy of the overall ADC circuitry. Moreover, the sample streams which are output at nodes $IOUT_A$ to $IOUT_D$ in FIG. 5 (also shown are corresponding nodes $IOUTB_A$ to $IOUTB_D$ to make up differential pairs) correspond to the sample streams output form the sampler circuitry 110 in FIG. 1. Thus, the operation of the stages of demultiplexing 120, 130 is also time critical.

FIG. 6 is a schematic circuit diagram of parts of ADC circuitry 100 useful for better understanding the structure and operation of the demultiplexing stages 120 and 130, which lead towards the sub-ADC units (ADC banks) 140, to appreciate the nature of the clock requirements.

For simplicity, only part of the sampler circuitry 110 is shown, corresponding to part of the sampler circuitry 800 of FIG. 5. That is, only the "plus" (left-hand) section of the sampler circuitry 800 is shown, with some elements omitted for simplicity.

Regarding the demultiplexing stages 120 and 130, only the demultiplexing circuitry for output $IOUT_A$ (see FIG. 5) is shown. Similar circuitry may also be provided for the other seven outputs $IOUT_B$ to $IOUT_D$, and $IOUTB_A$ to $IOUTB_D$.

As shown in FIG. 6, the demultiplexing stages 120 and 130 constitute two consecutive stages of demultiplexing. The first stage 120 performs 1:N demultiplexing, and the second stage 130 performs 1:M demultiplexing.

Stages 120 and 130 generally have the same structure as the array of sampling switches SW of the sampler circuitry 110 or 800. That is, each stage comprises a plurality of transistors (in this case, n-channel MOSFETs) whose source terminals are connected together at a common tail node.

From the above description of sampler circuitry 800, and considering only the "plus" section 54 by way of example, it will be appreciated that the circuitry splits the input current $I_{IN}$ into X time-interleaved trains of pulses, where X=4 in the present embodiment. In the present embodiment, those pulse trains are provided at outputs $IOUT_A$ to $IOUT_D$. The sampler circuitry 100 can thus be thought of as performing a 1:X demultiplexing function. In the same way, each output from sampler circuitry can be further 1:N demultiplexed by stage 120, and each output of stage 120 can be further 1:M demultiplexed by stage 130.

Only one complete demultiplexed path is shown in FIG. 6. That is, input current $I_{IN}$ is demultiplexed to provide X (X=4 in the present case) outputs $IOUT_A$ to $IOUT_D$. Each of those outputs is then 1:N demultiplexed by stage 120, however this is only shown in FIG. 6 in respect of the left-most output $IOUT_A$. Consequently, the outputs from that shown stage 120 are outputs $IOUT_{A10}$ to $IOUT_{A1(N-1)}$. Each of those outputs (across the full stage 120) is then 1:M demultiplexed by stage 130, however this is again only shown in FIG. 6 in respect of the left-most output $IOUT_{A10}$. Consequently, the outputs from that shown part of stage 130 are outputs $IOUT_{A1020}$ to $IOUT_{A102(M-1)}$. Corresponding outputs are produced by the rest of stage 130.

The sampler circuitry 110/800 and the demultiplexing stages 120 and 130 together carry out a 1:Z demultiplexing function, where Z=X×N×M. In the present example, X=4, N=8 and M=10. Thus, the present example performs 1:320 demultiplexing (in line with the earlier description above), which leads to 320 outputs on the "plus" side and a corresponding 320 outputs on the corresponding "minus" side (right-hand part of FIG. 5).

Looking back to FIG. 1, the output signals from the demultiplexing stages 120 and 130 pass into the sub-ADC units (ADC banks) 140. The sub-ADC units (ADC banks) 140 are used to produce digital values corresponding to the areas of the respective current pulses input thereto.

As can be appreciated from FIG. 6, the timings of the time-interleaved clock signals input to the transistors of the demultiplexing stages 120 and 130 must be synchronized/aligned and correctly ordered. Similar considerations are of course true of the clock requirements of the stages of multiplexing/retiming 220, 230 and 240.

In effect, in FIG. 1 a large number of very fast time-interleaved clock signals, for example including the 16 GHz signals CLK ϕ1 to CLK ϕ4 and 4 GHz and 1 GHz signals, need to be generated and distributed, with the clock signals being suitably synchronised and correctly ordered in time for the overall circuitry 10 or 100 or 200 to operate correctly. In particular, many fast clock signals (e.g. 4 GHz and 1 GHz) are required by the DEMUX (demultiplexers) 120, 130 and sub-ADC units 140 in the ADC circuitry 100 and the MUX (multiplexers or retimers) 220, 230, 240 in the DAC circuitry 200.

FIG. 7 is a simplified schematic diagram representing an overall system 900, e.g. a semiconductor chip, comprising mixed-signal (DAC or ADC) circuitry. A plurality of ADC and DAC circuits could be provided together in a single such system (each such separate ADC or DAC circuit will be referred to as a "channel" herein). By way of example, four ADC circuits 910 (i.e. four channels) are shown together in FIG. 7. Of course, the number of ADC/DAC circuits provided together could vary from system to system, and combinations of ADC and DAC circuits could be provided.

In FIG. 7, it is assumed that an ADC circuit 910 corresponds to the combination of ADC circuitry 100 and clock generation and distribution circuitry 300 of FIG. 1.

In FIG. 7, a common 2 GHz reference clock signal REFCLK is supplied to the four ADC circuits via a clock tree 920, the reference clock signal REFCLK corresponding to that shown in FIG. 1. The clock tree 920 is configured so that the clock signals as input to the ADC circuits 910 are closely (ideally, perfectly) synchronised, i.e. identical.

Also input to the four ADC circuits 910 are separate analogue input signals and reset signals. The analogue input signals each correspond to the analogue input to ADC circuitry 100 of FIG. 1. The reset signals could be provided in common to the four ADC circuits 910. Each ADC circuit 910 outputs its own data signal and a single 500 MHz clock signal, each output data signal corresponding to the digital output data signal of the ADC circuitry 100 of FIG. 1.

The present inventors have identified a problem of how to ensure that the various internal operations of each ADC circuit 910 (i.e. channel) are properly synchronised as well as how to ensure synchronised operation between the different ADC circuits 910 (i.e. channels). For example, as apparent from the description of FIGS. 1 to 6, within each ADC circuit 910 various clock signals are generated from REFCLK which in turn generate the output 500 MHz clock signal. As such, various circuit elements are employed and those elements may (on reset of the ADC circuitry 910) come online in an at least partly undefined manner, creating synchronisation problems both within each ADC circuit and between them. Similar considerations also apply if the channels are DAC channels.

It is desirable to solve one or more of the above problems. It is desirable to solve such problems without requiring any high-speed synchronisation signals between the channels (e.g. ADC circuits 910, or corresponding DAC circuits), and without requiring any time-critical reset signals within each channel or between them.

According to a first aspect of the present invention, there is provided signal-alignment circuitry, comprising: phase-rotation circuitry connected to receive one or more input clock signals and operable to generate therefrom one or more output clock signals; and control circuitry operable to control the amount of phase rotation applied by the phase-rotation circuitry to carry out a plurality of alignment operations, the alignment operations comprising: one or more first operations each comprising rotating one or more of said output clock signals relative to one or more of the other said output clock signals, so as to bring a phase relationship between said output clock signals, or derived clock signals derived therefrom, towards or into a given phase relationship; and one or more second operations each comprising rotating all of said output clock signals together, so as to bring a phase relationship between said output or derived clock signals and said input clock signals or an external-reference signal towards or into a given phase relationship.

Although such clock signals are preferred signals to which the present invention may be applied, the invention may be applied to other signals such as control or data signals, and the disclosure will be understood accordingly.

Such phase-rotation circuitry may comprise phase interpolation circuitry. The input clock signals may be time-interleaved clock signals, for example a set of four time-interleaved sinusoidal clock signals. The output clock signals may also be such time-interleaved clock signals. The input and output clock signals may have the same shape and characteristic frequency.

The first operations may comprise rotating two or more of the output clock signals relative to two or more of the other output clock signals. The first operations may all comprise rotating a particular two output clock signals relative to another particular two output clock signals. The given phase relationship may be a relationship in which the output clock signals, or derived clock signals, are aligned or synchronised and ordered relative to one another.

The second operations may comprise rotating the output/derived clock signals together so as to preserve their internal alignment but bring them together into alignment or synchronisation with the input clock signals or the external-reference signal.

The first operations may comprise rotating one or more of the output clock signals relative to one or more other said output clock signals by an integer number of full rotations (i.e. full phase rotations, of 360 degrees or $2\pi$ radians), so as to preserve a phase relationship between the output clock signals.

The phase-rotation circuitry may comprise a plurality of phase rotators (e.g. phase interpolators), each operable to generate one or more of the output clock signals based on one or more of the input clock signals. The first operations may comprise controlling the amount of phase rotation applied by each of the phase rotators, i.e. individually.

The derived clock signals may be derived from the output clock signals by division (e.g. using clock dividers). The first operations may comprise rotating one or more of the output clock signals relative to one or more other output clock signals by an integer number of full rotations to adjust a phase relationship between the derived signals.

For example, the derived clock signals may be generated by at least first and second dividers, each receiving different said output clock signals. Each of the dividers may receive its output clock signals from a different one of the phase rotators. The dividers might not (initially) be synchronised with one another. Such first operations may bring the dividers into synchronisation, in the sense that the derived clock signals are aligned or synchronised and ordered relative to one another.

The second operations may comprise rotating the output signals by a fractional amount of a full rotation, e.g. by less than a full rotation. The second operations may comprise rotating the output signals in a series of steps, where each step is smaller than 45 degrees, and preferably smaller than 15 degrees, and more preferably smaller than 6 degrees. Each step may be 360/64 degrees.

The circuitry may comprise phase-detection circuitry operable to detect phase differences between at least pairs of said signals. The control circuitry may be operable to carry out the first and second operations in dependence upon one or more phase differences detected by the phase-detection circuitry.

The phase-detection circuitry may comprise a derived-signal phase detector operable to detect phase differences between at least first and second derived clock signals. The control circuitry may be operable to carry out one or more of the first operations in dependence upon a phase difference detected by the derived-signal phase detector.

The phase-detection circuitry may comprise an external-reference phase detector operable to detect phase differences between at least one output or derived clock signal and the external-reference signal. The control circuitry may be operable to carry out one or more of the second operations in dependence upon a phase difference detected by the external-reference phase detector.

The phase-detection circuitry may comprise an input-output phase detector operable to detect phase differences between at least one output or derived clock signal and at least one input clock signal. The control circuitry may be operable to carry out one or more of the second operations in dependence upon a phase difference detected by the input-output phase detector.

The phase-rotation circuitry may be configured to operate based on a digital input. The control circuitry may be operable to provide the digital input to the phase-rotation circuitry to digitally control the amount of applied phase rotation. The digital input may comprise a digital code, which indicates one of a number of possible discrete phase positions.

The control circuitry may be operable to carry out the first operations before the second operations. The control circuitry may be operable to carry out: (a) the second operations to bring a phase relationship between said output or derived clock signals and said external-reference signal towards or into a given phase relationship; before carrying out (b) other second operations to bring a phase relationship between said output or derived clock signals and said input clock signals towards or into a given phase relationship.

According to a second aspect of the present invention, there is provided data-handling circuitry, comprising: signal-alignment circuitry according to the aforementioned first aspect of the present invention; first clock-controlled circuitry configured to handle data based on at least one said input clock signal; and second clock-controlled circuitry configured to handle data based on at least one said output or derived clock signal.

Such data-handling circuitry may be digital-to-analogue converter circuitry or analogue-to-digital converter circuitry, operable to convert the handled data between digital and analogue forms.

According to a third aspect of the present invention, there is provided a system comprising a plurality of sets of signal-alignment circuitry according to the aforementioned first aspect of the present invention or a plurality of sets of data-handling circuitry according to the aforementioned second aspect of the present invention, wherein the external-reference signal is the same for each said set.

In such a system, the sets of circuitry may be configured to carry out their first and second operations in parallel with one another. In such a system it may be that at least one set of data-handling circuitry is digital-to-analogue converter circuitry and at least one set of data-handling circuitry is analogue-to-digital converter circuitry.

According to a fourth aspect of the present invention, there is provided an IC chip comprising signal-alignment circuitry according to the aforementioned first aspect of the present invention, or data-handling circuitry according to the aforementioned second aspect of the present invention, or a system according to the aforementioned third aspect of the present invention.

According to a fifth aspect of the present invention, there is provided a method for use in signal-alignment circuitry, the circuitry comprising phase-rotation circuitry connected to receive one or more input clock signals and operable to generate therefrom one or more output clock signals, the method comprising: one or more first operations each comprising rotating one or more of said output clock signals relative to one or more of the other said output clock signals, so as to bring a phase relationship between said output clock signals, or derived clock signals derived therefrom, towards or into a given phase relationship; and one or more second operations each comprising rotating all of said output clock signals together, so as to bring a phase relationship between said output or derived clock signals and said input clock signals or an external-reference signal towards or into a given phase relationship.

According to a sixth aspect of the present invention, there is provided signal-alignment circuitry, comprising: phase-rotation circuitry connected to receive one or more input clock signals and operable to generate one or more output clock signals therefrom; phase-detection circuitry operable to detect a phase difference between at least first and second signals, the first signal being one of said output clock signals or a signal based thereon and the second signal being a synchronisation-reference signal; and control circuitry operable to control the amount of phase rotation applied by the phase-rotation circuitry in dependence upon the detected phase difference so as to bring a phase relationship between said output clock signals or such signals based thereon and said synchronisation-reference signal towards a given phase relationship.

The second signal may be one of said input or output clock signals or a signal based thereon, being a signal different from the first signal. The second signal may be a signal other than one of said input or output clock signals or a signal based thereon. The second signal may be a reference clock signal.

The phase-rotation circuitry may comprise a plurality of phase rotators, each operable to generate one or more said output clock signals based on a corresponding one or more said input clock signals. The control circuitry may be operable to control the amount of phase rotation applied (individually) by each of the phase rotators so as to bring a phase relationship between the output signals or signals based thereon towards a given phase relationship.

There may be provided a plurality of clock-signal generators each connected to receive the output clock signal or signals of a corresponding one of the phase rotators and generate derived clock signals based upon those output clock signals. The phase-detection circuitry may comprise a derived-signal phase detector operable to detect a phase difference between at least first and second derived clock signals generated by different clock-signal generators. The control circuitry may be operable to control the amount of phase rotation applied by at least one of the phase rotators relative to the phase rotation applied by another one of the phase rotators in dependence upon the phase difference detected by the derived-signal phase detector so as to bring a phase relationship between the derived clock signals towards a given phase relationship.

The phase-rotation circuitry may comprise first and second said phase rotators. The first phase rotator may be connected to receive some or all of the input clock signals, and operable to generate therefrom first and third said output clock signals. The second phase rotator may be connected to receive some or all of the input clock signals, and operable to generate therefrom second and fourth said output clock signals.

The input clock signals may be respective phases of a four-phase clock signal. The input clock signals may be evenly time-interleaved.

The first and third output clock signals may be substantially in antiphase. The second and fourth output clock signals may be substantially in antiphase. The first and third output clock signals may be substantially in quadrature with the second and fourth output clock signals, respectively.

There may be provided clock-controlled circuitry having first and second dividers. The first divider may be operable to receive the output signals of the first phase rotator and to output first divided (derived) clock signals. The second divider may be operable to receive the output signals of the second phase rotator and to output second divided (derived) clock signals. The derived-signal phase detector may be operable to detect a phase difference between at least one first divided clock signal and at least one second divided clock signal as the first and second derived clock signals.

The control circuitry may be operable to carry out the control by causing one of the phase rotators to rotate the phase of its output clock signal or signals by an integer number of full rotations relative to any rotation applied by another one of those phase rotators.

The control circuitry may be operable to carry out the control by causing one of the phase rotators to rotate the phase of its output clock signal or signals by an integer number of full rotations and another one of those phase rotators to maintain its amount of applied phase rotation.

The phase-detection circuitry may comprise an external-reference phase detector operable to detect a phase difference between at least one output clock signal or a signal based thereon and a reference clock signal. The control circuitry may be operable to control the amount of phase rotation applied by the phase-rotation circuitry in dependence upon the phase difference detected by the external-reference phase detector so as to bring a phase relationship between at least that output signal and said reference clock signal towards a given phase relationship. The control circuitry may be operable to carry out the control by causing the phase-rotation circuitry to rotate the output clock signals together by the same amount (one or more times). The amount may be substantially less than a quarter rotation, and preferably substantially less than 6 degrees.

The phase-detection circuitry may comprise an input-output phase detector operable to detect a phase difference between at least one output clock signal and at least one input clock signal. The control circuitry may be operable to control the amount of phase rotation applied by the phase-rotation circuitry in dependence upon the phase difference detected by the input-output phase detector so as to bring a phase relationship between at least those output and input clock signals towards a given phase relationship. The control circuitry may be operable to carry out the control by causing the phase-rotation circuitry to rotate the output clock signals together by the same amount (one or more times). The amount may be substantially less than a quarter rotation, and preferably substantially less than 6 degrees.

The control circuitry may be configured to carry out the control in dependence upon the phase difference detected by the derived-signal phase detector before carrying out the control in dependence upon the phase difference detected by the external-reference phase detector or the input-output phase detector. The control circuitry may be configured to carry out the control in dependence upon the phase difference detected by the derived-signal phase detector as a first control operation, and then to carry out the control in dependence upon the phase difference detected by the external-reference phase detector as a second control operation, and then to carry out the control in dependence upon the phase difference detected by the input-output phase detector as a third control operation.

The phase-rotation circuitry may comprise one or more phase interpolators. The signal-alignment circuitry may be part of digital-to-analogue converter circuitry or analogue-to-digital converter circuitry.

According to a seventh aspect of the present invention, there is provided data-handling circuitry, comprising: signal-alignment circuitry according to the aforementioned sixth aspect of the present invention; first clock-controlled circuitry configured to handle data based on at least one said input clock signal or a clock signal derived therefrom; and second clock-controlled circuitry configured to handle data based on at least one said output clock signal or a signal based thereon.

Such data-handling circuitry may be digital-to-analogue converter circuitry or analogue-to-digital converter circuitry, operable to convert the handled data between digital and analogue forms.

According to an eighth aspect of the present invention, there is provided a system comprising a plurality of sets of signal-alignment circuitry according to the aforementioned sixth aspect of the present invention or a plurality of sets of data-handling circuitry according to the aforementioned seventh aspect of the present invention, wherein the reference clock signal is the same for each said set. In such a system it may be that at least one set of data-handling circuitry is digital-to-analogue converter circuitry and at least one set of data-handling circuitry is analogue-to-digital converter circuitry.

According to a ninth aspect of the present invention, there is provided an IC chip comprising signal-alignment circuitry according to the aforementioned sixth aspect of the present invention, or data-handling circuitry according to the aforementioned seventh aspect of the present invention, or a system according to the aforementioned eighth aspect of the present invention.

According to a tenth aspect of the present invention, there is provided a signal-alignment method, comprising: receiving one or more input clock signals and applying a controllable amount of phase rotation thereto so as to generate one or more output clock signals; detecting a phase difference between at least first and second signals, the first signal being one of said output clock signals or a signal based thereon and the second signal being a synchronisation-reference signal; and controlling the amount of phase rotation applied by the phase-rotation circuitry in dependence upon the detected phase difference so as to bring a phase relationship between said output clock signals or such signals based thereon and said synchronisation-reference signal towards a given phase relationship.

Such a method may be for use in signal-alignment circuitry comprising a plurality of phase rotators, each operable to generate one or more said output clock signals based on a corresponding one or more said input clock signals, and a plurality of clock-signal generators each connected to receive the output clock signal or signals of a corresponding one of the phase rotators and generate derived clock signals based upon those output clock signals, the method comprising: a first control operation, comprising: detecting a phase difference between at least first and second said derived clock signals generated by different said clock-signal generators; and controlling the amount of phase rotation applied by at least one of said phase rotators relative to the phase rotation applied by another one of the phase rotators in dependence upon the phase difference detected in the first operation so as to bring a phase relationship between the derived clock signals towards a given phase relationship; a second control operation comprising: detecting a phase difference between at least one said output clock signal or a signal based thereon and a reference clock signal; and controlling the amount of phase rotation applied to the output signals in dependence upon the phase difference detected in the second operation so as to bring a phase relationship between at least that output signal and said reference clock signal towards a given phase relationship; and a third control operation, comprising: detecting a phase difference between at least one said output clock signal and at least one said input clock signal; and controlling the amount of phase rotation applied to the output signals in dependence upon the phase difference detected in the second operation so as to bring a phase relationship between at least those output and input clock signals towards a given phase relationship.

The first, second and third control operations may be carried out in that order. The first, third and second control operations may be carried out in that order.

Reference will now be made by way of example to the accompanying drawings, of which:

FIG. 1, as mentioned above, is a schematic diagram showing parts of example combined DAC and ADC circuitry;

FIG. 2, as mentioned above, is a schematic view of a differential switching circuit, which may form part of the switching circuit of the DAC circuitry of FIG. 1;

FIG. 3, as mentioned above, is a schematic diagram presenting an example 16 GHz, 4-phase clock signal;

FIG. 4, as mentioned above, presents waveforms for use in better understanding the operation of the differential switching circuit of FIG. 2;

FIG. 5, as mentioned above, is a schematic view of sampler circuitry which may form part of the sampler circuitry FIG. 1;

FIG. 6, as mentioned above, is a schematic circuit diagram of parts of the ADC circuitry of FIG. 1, useful for better understanding the structure and operation of the demultiplexing stages;

FIG. 7, as mentioned above, is a simplified schematic diagram representing an overall system comprising mixed-signal (DAC or ADC) circuitry;

FIG. 8 is a schematic diagram of a system 1000 embodying the present invention. System 1000 comprises a clock generator A 1010, phase-rotation circuitry 1020, a clock generator B 1030, phase-detection circuitry 1040, control circuitry 1050, clock-controlled circuitry A 1060 and clock-controlled circuitry B 1070.

The clock generator A 1010 is connected to receive a reference clock signal REFCLK, and based on that signal to generate one or more clock signals which may be referred to as source or input clock signals since they control or govern the operation of the other elements of the system. For convenience, the following description will assume that a plurality of input clock signals are generated. The clock generator A 1010 may generate a set of time-interleaved input signals, for example time-interleaved sinusoidal input signals. The set may comprise four such input signals.

The phase-rotation circuitry 1020 is connected to receive the input clock signals and operable to apply a controllable amount of phase rotation thereto so as to generate one or more output clock signals. The phase-rotation circuitry 1020 may be configured to phase rotate all of the output signals together, or individually, or in pairs/groups.

Figure 8:
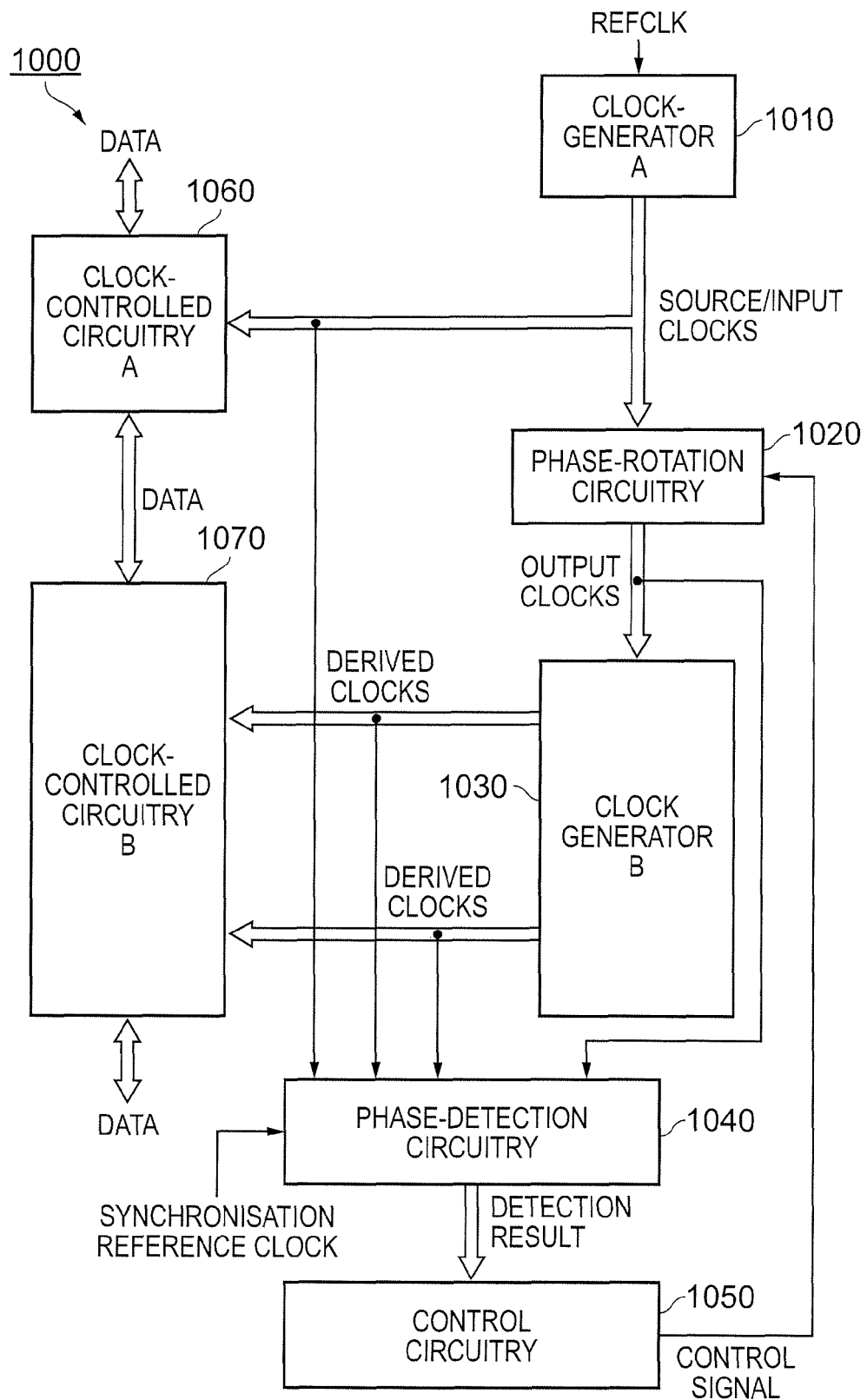
FIG. 8 is a schematic diagram of a system embodying the present invention.

The clock generator B 1030 is connected to receive the output clock signals, and to generate or derive a set of derived clock signals based on the output clock signals. Two such sets are shown in FIG. 8, however one or more such sets may be generated. The clock generator B 1030 may for example function as a divider, creating derived clock signals with lower characteristic frequencies than the output clock signals.

The clock-controlled circuitry A 1060 is connected to receive the input clock signals and operable to function under the control of those clock signals. The clock-controlled circuitry B 1070 is connected to receive the derived clock signals and operable to function under the control of those clock signals. Of course, the clock-controlled circuitry B 1070 may also be connected to receive the output clock signals and be operable to function under the control of those clock signals.

The clock-controlled circuitry A and B 1060 and 1070 are shown as handling data signals (in digital or analogue form). Further, although not essential, those circuits are shown as inputting and/or outputting such data signals, between one another. Such clock-controlled circuitry may form part of digital-to-analogue converter circuitry or analogue-to-digital converter circuitry.

The phase-detection circuitry 1040 is shown as receiving one or more of the input, output and derived clock signals (or a signal based thereon). It may (although not shown) also receive one or more signals from within the clock-controlled circuitry A 1060 or clock-controlled circuitry B 1070. It may receive all of those signals, or simply one or more of those signals.

The phase-detection circuitry 1040 is operable to detect a phase difference between at least first and second signals, the first signal being one of the received signals mentioned above (or a signal based thereon) and the second signal being a synchronisation-reference signal as shown.

The second signal may (although not explicitly shown for simplicity) be one of the input, output, or derived clock signals (or a signal based thereon), being a signal different from the first signal. For example, the first and second signals may be two different derived clock signals. The second signal may also be a signal other than one of the input, output, or derived clock signals (or a signal based thereon). For example, the second signal may be a reference clock signal supplied from an external source.

The phase-detection circuitry 1040 may be operable to detect a phase difference between different first and second signals during different control operations, as will become apparent.

The control circuitry 1050 is operable to control the amount of phase rotation applied by the phase-rotation circuitry 1020 by way of a control signal as shown, in dependence upon a detection result of the phase-detection circuitry 1040 (i.e. a detected phase difference), so as to bring a phase relationship between said output clock signals or such signals based thereon and said synchronisation-reference signal towards a given phase relationship.

For example, in a first control operation, the phase-detection circuitry 1040 may be operable to detect a phase difference between different derived clock signals, and the control circuitry 1050 may be operable to control the amount of phase rotation applied by the phase-rotation circuitry 1020 so as to align the derived clock signals with one another in a desired pattern of alignment. Through such an operation, or successive such operations, it may be possible to align/synchronise all of the derived clock signals with one another. This may have the effect of ensuring that the clock-controlled circuitry B 1070 operates as desired.

As another example, in a second control operation, the phase-detection circuitry 1040 may be operable to detect a phase difference between an output or derived clock signal and a reference clock signal supplied from an external source, and the control circuitry 1050 may be operable to control the amount of phase rotation applied by the phase-rotation circuitry 1020 so as to align/synchronise/arrange the output and/or derived clock signal with the reference clock signal. Through such an operation, or successive such operations, it may be possible to align/synchronise all of the derived/output clock signals with the reference clock signal. This may have the effect of ensuring that the system 1000 (representing a channel) operates in synchronisation with another such system 1000 (representing another channel), where both are supplied with the same reference clock signal, and undergo such second control operations.

As a further example, in a third control operation, the phase-detection circuitry 1040 may be operable to detect a phase difference between an output or derived clock signal and an input clock signal, and the control circuitry 1050 may be operable to control the amount of phase rotation applied by the phase-rotation circuitry 1020 so as to align/synchronise/arrange the output and/or derived clock signal with the input clock signal. Through such an operation, or successive such operations, it may be possible to align/synchronise all of the derived/output clock signals with the input clock signals. This may have the effect of ensuring that the clock-controlled circuitry B 1070 operates in synchronisation with the clock-controlled circuitry A 1060. For example, there may be switching or other delays in clock-controlled circuitry A 1060 and/or clock-controlled circuitry B 1070, and such a third control operation may be suitable to adjust operation of those circuits relative to one another to account for any such delays and enable them to handle data signals together as desired.

Figure 7:
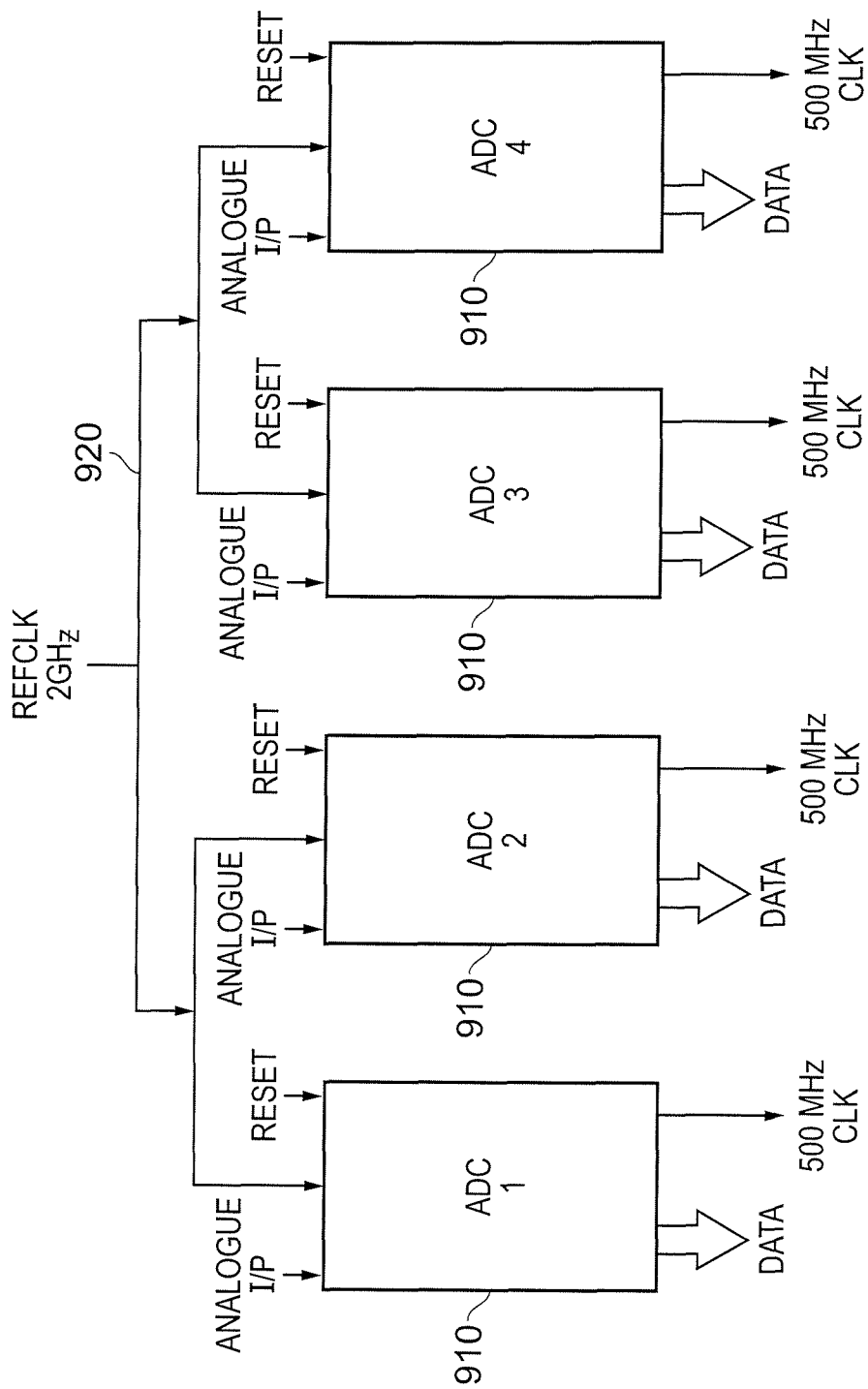
Figure 9:
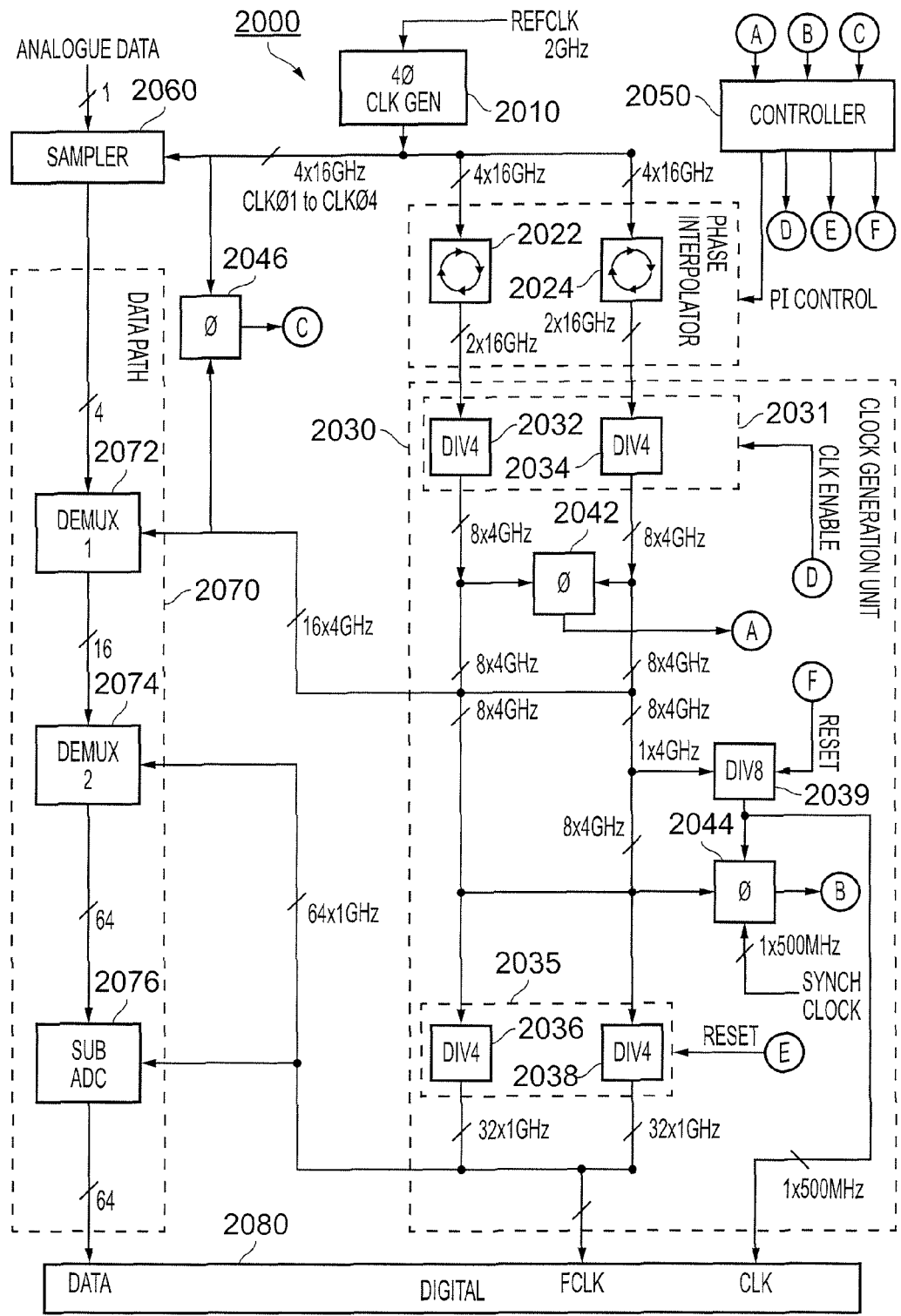
FIG. 9 is a schematic diagram of another system embodying the present invention.

FIG. 9 is a schematic diagram of a system 2000 embodying the present invention. As will become apparent, system 2000 has the functionality of an analogue-to-digital converter, and corresponds to the ADC circuitry 100 and clock generation and distribution circuitry 300 of FIG. 1. One ADC channel is shown in FIG. 9, although it is understood that others may be present on the same chip, as in FIG. 7.

System 2000 comprises a clock generator A 2010, phase-rotation circuitry 2020, a clock generator B 2030, phase-detection circuitry (elements of which are identified in FIG. 9 as discussed below), control circuitry (controller) 2050, clock-controlled circuitry A 2060 and clock-controlled circuitry B 2070, and these correspond to the equivalent elements in FIG. 8 (and as such are denoted with similar reference numerals).

Figure 3:
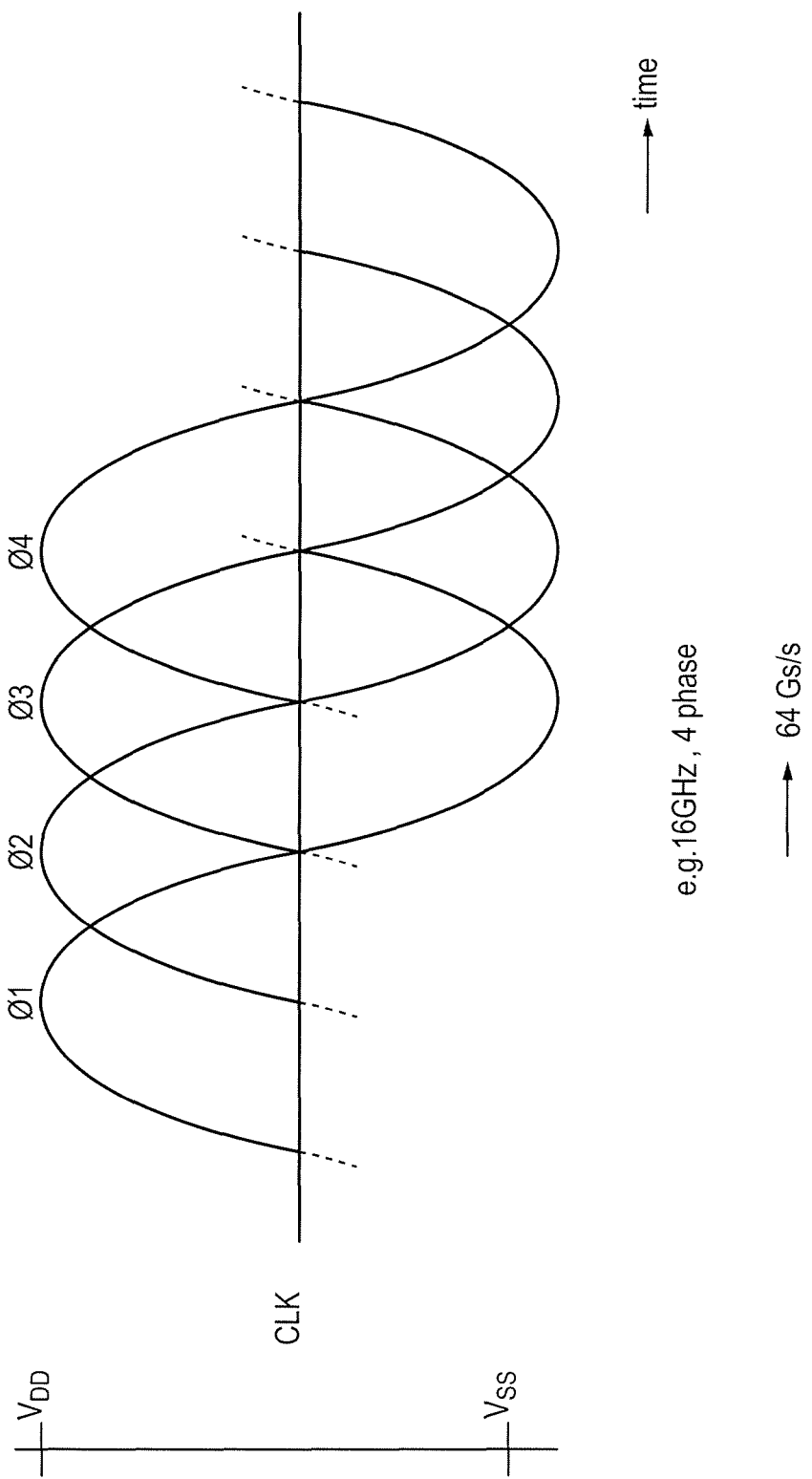
Figure 4:
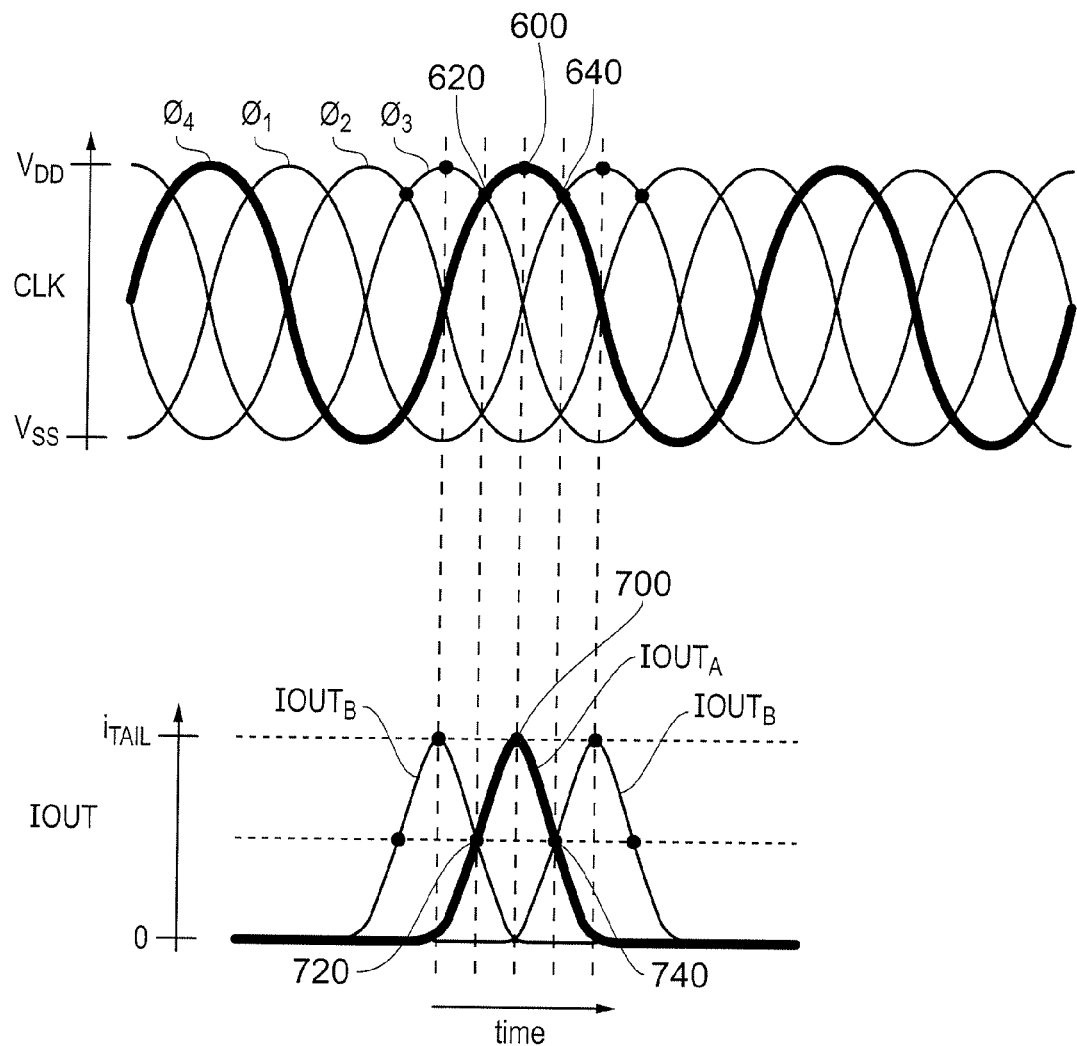

The clock generator A 2010 is a four-phase clock generator, and is connected to receive a reference clock signal REF-CLK which in this example is a 2 GHz signal. The clock generator A 2020 is operable to output a 4-phase 16 GHz sinusoidal input clock signals. The 4×16 GHz output signals are indicated in FIG. 9, and correspond to the 16 GHz, 4-phase clock signal depicted in FIG. 3, i.e. comprising the clock signals CLK ϕ1 to CLK ϕ4.

The phase-rotation circuitry 2020 is connected to receive the input clock signals and operable to apply a controllable amount of phase rotation thereto so as to generate one or more output clock signals. In particular, the phase-rotation circuitry 2020 is implemented as an overall phase interpolator, which comprises two phase interpolators (or phase rotators) 2022 and 2024.

The "even" phase interpolator 2022 receives all four clock signals CLK ϕ1 to CLK ϕ4, i.e. 4×16 GHz signals, and outputs 2×16 GHz output clock signals (corresponding to CLK ϕ1 and CLK ϕ3—which themselves may have phases 0° and 180°) whose phases may or may not be rotated relative to the input clock signals. Similarly, the "odd" phase interpolator 2024 receives all four clock signals CLK ϕ1 to CLK ϕ4, i.e. 4×16 GHz signals, and outputs 2×16 GHz output clock signals (corresponding to CLK ϕ2 and CLK ϕ4—which themselves may have phases 90° and 270°) whose phases may or may not be rotated relative to the input clock signals. Thus, each phase Interpolator 2022, 2024 uses all 4 input clock phases CLK φ1 to CLK φ4. However, the input clock phases for the "odd" phase interpolator 2024 may be 90 degrees shifted relative to those for the "even" phase interpolator, such that for the same input phase-interpolator code of 0 (i.e. under digital control) the outputs of the "even" phase interpolator 2022 are 0° and 180° and the outputs of the "odd" phase interpolator 2024 are 90° and 270°.

Given the separate "even" and "odd" phase interpolators 2022 and 2024, the overall phase interpolator 2020 is operable (under control from the control circuitry 2050) to rotate the phases of the output signals of one of those phase interpolators 2022, 2024 separately from those of the other.

The clock generator B 1030 is a clock generation unit connected to receive the pairs of output clock signals from the phase interpolators 2022 and 2024. Firstly, those pairs pass into respective dividers 2032 and 2034 of a divider unit 2031, which in this case are ÷4 (DIV4) dividers. Each of those dividers 2032, 2034 outputs an interleaved set of 8×4 GHz clock signals, as shown, which pass to further dividers 2036 and 2038 of a divider unit 2035, which in this case are also ÷4 (DIV4) dividers. Each of those dividers 2036, 2036 outputs an interleaved set of 32×1 GHz clock signals, as shown. Also shown is a further divider 2039, which receives one of the 4 GHz clock signals. This divider 2039 is a ÷8 (DIV8) divider, and thus outputs a 500 MHz clock signal. These 4 GHz and 1 GHz clock signals may be referred to as derived clock signals, since they are all derived from the output clock signals (and ultimately from the input clock signals, and REFCLK).

The clock-controlled circuitry A 2060 is connected to receive the input clock signals CLK φ1 to CLK φ4 and operable to function under the control of those clock signals. Here, the clock-controlled circuitry A 2060 is indicated as being a sampler, and its circuitry corresponds to the sampler circuitry 110 and 800 described above.

The clock-controlled circuitry B 2070 is a data path (carrying streams of current pulses output from the clock-controlled circuitry A 2060) connected to receive the derived clock signals, i.e. the 4 GHz and 1 GHz clock signals mentioned above, and operable to function under the control of those clock signals.

As indicated in FIG. 9, the clock-controlled circuitry B 2070 has 2-stages of demultiplexing shown as 2072 and 2074, each performing 1:4 demultiplexing, and sub-ADC units 2076. These correspond respectively to the 2-stages of demultiplexing 120 and 130 and the sub-ADC units 140 of FIG. 1. The first stage of demultiplexing 2072 receives 4 16 Gs/s signals (current pulse streams) from the clock-controlled circuitry A 2060, and outputs 16 4 Gs/s signals to the second stage of demultiplexing 2074, which in turn outputs 64 1 Gs/s signals to ADC units 2076. The first stage of demultiplexing 2072 receives the 16 4 GHz clock signals output by the divider unit 2031, and the second stage of demultiplexing 2074 and the ADC units 2076 receive the 64 1 GHz clock signals output by the divider unit 2035. This is also in line with FIG. 1.

The ADC units 2076 convert the input pulse streams into digital (e.g. 8-bit) values, and output those to a digital section 2080 as indicated. Also output to the digital section 2080 is the 500 MHz clock signal from the divider 2039 and (optionally) the 1 GHz clock signals from the divider unit 2035.

The clock-controlled circuitry A and B 2060 and 2070 are considered to handle data signals (in digital form, e.g. as 8-bit values, or in analogue form, e.g. as streams of current pulses).

The phase-detection circuitry of system 2000 comprises a first phase detector 2042, a second phase detector 2044 and a third phase detector 2046. Each phase detector is operable to detect a phase difference between at least first and second signals as shown.

The first phase detector 2042 (a derived-signal phase detector) is connected to receive at least one of the 4 GHz derived clock signals output from the divider 2032 (originating from the "even" phase interpolator 2022), and at least one of the 4 GHz derived clock signals output from the divider 2034 (originating from the "odd" phase interpolator 2024). It may receive some or all of the 4 GHz clock signals. The result of the phase detection is sent to the control circuitry (controller) 2050 via path A.

The second phase detector 2044 (an external-reference phase detector) is connected to receive the 500 MHz derived clock signal output from the divider 2039 and a 500 MHz synchronisation clock signal (SYNCH CLOCK) received from outside the system 2000. It may also receive some or all of the 4 GHz clock signals mentioned above, and as indicated in FIG. 9. The result of the phase detection is sent to the control circuitry (controller) 2050 via path B.

The third phase detector 2046 (an input-output phase detector) is connected to receive at least one of the 4 GHz derived clock signals output from the divider unit 2031 and at least one of the 16 GHz input clock signals. It may receive some or all of the 4 GHz and 16 GHz clock signals. The result of the phase detection is sent to the control circuitry (controller) 2050 via path C.

The phase interpolation (PI) circuitry 2020 enables phase rotation of the four-phase 16 GHz clock signals which are used by the divider unit 2031 (÷4) to generate the 16-phase 4 GHz clock signals. In particular, the two phase interpolators (PIs) 2022 and 2024 may for example be digitally controlled as mentioned above and have e.g. 64 steps per cycle, corresponding to approximately 1 ps steps (given 16 GHz clock signals). This digital control with 64 steps will be assumed for convenience in the following description.

The methodology adopted in system 2000 will now be explained by way of the following stages.

Stage 1: Internal Channel Clock Alignment

Firstly, the clock generator A 2010, which may contain phase-lock loop (PLL) and polyphase filter (PPF) circuitry, is enabled to supply the 4-phase 16 GHz signals to the clock-controlled circuitry A (sampler circuitry) 2060 and phase-rotation circuitry (phase interpolators, PIs) 2020.

At this stage, both PIs 2022 and 2024 are at digital control code (i.e. applying zero phase rotation). The inputs to the "odd" and "even" PIs are 90 degrees out of phase such that for both PIs with the same phase code the PI outputs are 90 degrees out of phase. This provides the quadrature clocks required by the ÷4 divider unit 2031 which receives the outputs of the PIs.

The two DIV4 dividers 2032 and 2034 that are driven by the phase interpolators 2022 and 2024, respectively, are also enabled and running at this stage. However, the DIV4 divider outputs which drive the DEMUX1 (first-stage demultiplexer 2072) and the 8×DIV4 dividers (shown for convenience as dividers 2036 and 2038) in the divider unit 2035 are not enabled yet, as at this stage the two DIV4 dividers 2032 and 2034 are not assumed to be aligned in the correct phase.

The first phase detector 2042 (a 4 GHz phase detector) is used to tell if the two DIV4 dividers 2032 and 2034 are in correct alignment, relative to one another, and outputs a result of the phase detection (PHASE DETECT (4 GHz)) to the control circuitry (controller) 2050 via path A as above.

If the two DIV4 dividers 2032 and 2034 are not in correct alignment, the control circuitry 2050 causes the phase-rotation circuitry 2020 to issue a control signal (PI CONTROL) to the phase-rotation circuitry 2020 to cause a single PI 2022 or 2024 to apply full phase rotations to place the 16-phase 4 GHz output clock signals in the correct order. Full rotation is from code 0 through all of the codes back to code 0—this maintains the correct phase relationship of the PI outputs relative to one another after a full rotation.

When the first phase detector 2042 (4 GHz phase detector) indicates that the two DIV4 dividers 2032 and 2034 are in correct alignment, the 16-phase 4 GHz clock outputs are then enabled with the CLK ENABLE signal via path D. This enable signal is timed onto the 16 phases such that the 16-phase clocks start in a known order. Effectively, each DIV4 divider 2032, 2034 itself has its own output (derived) clocks configured to be aligned correctly relative to one another, with the above phase rotation dealing with any misalignment between the two DIV4 dividers 2032 and 2034.

The following 8×DIV4 dividers (shown for convenience as dividers 2036 and 2038) in the divider unit 2035 and the DIV8 divider 2039 are then reset to a known starting position by way of RESET signals via paths E and F, and (as mentioned above) the clocks to them are started in a known order. As such, the phase relationship of all of the 64-phase 1 GHz clocks and the 500 MHz clock are known and in the correct phase relationship.

In the present example, the reset of the DIV4 dividers 2036, 2038 happens before the CLK ENABLE starts the 16×4 GHz clocks. In fact, the DIV4 dividers 2036, 2038 may be in reset at start-up to set them to a known state—and then come out of reset before the CLK ENABLE signal is issued. As such, there may be no timing requirements for the reset signal via path E. The DIV4 dividers 2036, 2038 may thus be in a known state without the clocks clocking and ready to begin an ordered start-up when the CLK ENABLE signal is issued (e.g. goes high).

At this point, all of the clock relationships are known within the single channel represented by system 2000. Where multiple such channels are provided on a single chip, it is assumed that the above steps are carried out per channel.

At this point, however, channel-to-channel alignment is not known (see Stage 2) and alignment of the DEMUX1 2072 to SAMPLER 2060 per channel is also not known (see Stage 3).

Stage 2: Channel-To-Channel Alignment

From Stage 1, alignment of all clock relationships are in the correct order within a single channel, such as the channel represented by system 2000. For synchronisation of multiple channels with one another, a single SYNCH CLOCK (500 MHz) as mentioned above is distributed to each channel (as well as REFCLK) such that for each channel the SYNC CLOCK is effectively identical. Such a SYNCH CLOCK could also be supplied to a channel as represented by system 2000 to synchronise/align its operation simply with that signal.

The second phase detector 2044 (a 500 MHz phase detector) is then used to align the channels one to another (PHASE DETECT (500 MHz)), or each to the SYNCH CLOCK signal. The second phase detector 2044 outputs a result of the phase detection (PHASE DETECT (500 MHz)) to the control circuitry (controller) 2050 via path B as above.

In this case, the control circuitry 2050 causes the phase-rotation circuitry 2020 to issue a control signal (PI CONTROL) to the phase-rotation circuitry 2020 to cause both PIs 2022 and 2024 to be rotated together (within each channel) to align the 500 MHz clock signal output by the DIV8 divider 2039 with the distributed SYNCH CLOCK. Fine phase steps (e.g. down to single code steps—under 6 degrees for 64 steps) are used to give close alignment to the SYNC CLOCK. Both PIs 2022 and 2024 will have the same code (as they are rotated together) to keep the required quadrature.

At this point, each channel has a known phase relationship to the other channels, or particularly, to the SYNCH CLOCK. The SAMPLER clocks (4-phase 16 GHz) are assumed to be well aligned between the channels due to the carefully distributed REFCLK (see FIG. 7) via a clock tree. The DEMUX1/DEMUX2 2072 and 2074 and DIV8 (500 MHz) 2039 are also aligned between channels.

However, alignment between the operation of the DEMUX1 2072 and the SAMPLER 2060 is still to be accomplished.

Stage 3: SAMPLER to DEMUX1 Alignment

As mentioned above, there may be switching or other delays in clock-controlled circuitry A 2060 (SAMPLER) and/or clock-controlled circuitry B 2070 (DEMUX1 etc.), and thus it is beneficial to adjust operation of those circuits relative to one another to account for any such delays and enable them to handle data signals together as desired.

SAMPLER to DEMUX1 alignment is accomplished by fine rotations of both PIs 2022 and 2024 together.

In the present system 2000, initially a software alignment (not shown explicitly in FIG. 9) is used for this alignment. The software phase alignment uses the DEMUX1 power sigma to find the correct alignment position. This is done for each channel separately and a decision is made for correct alignment for each channel such that each channel is aligned to the same sample pulse (of the SAMPLER).

After this decision, a hardware aligner comprising the third phase detector 2046 is enabled to keep alignment of each channel to this pulse. Thus, within example system 2000 (which represents one channel), the third phase detector 2046 outputs a result of the phase detection to the control circuitry (controller) 2050 via path C as above.

In this case, the control circuitry 2050 causes the phase-rotation circuitry 2020 to issue a control signal (PI CONTROL) to the phase-rotation circuitry 2020 to cause both PIs 2022 and 2024 to be rotated together (within each channel) to keep the alignment to the correct sample pulse as initial set up by the software alignment. Fine phase steps (e.g. down to single code steps) are used to give close alignment. Both PIs 2022 and 2024 will have the same code (as they are rotated together) to keep the required quadrature. This digital feedback loop steps the PIs 2022 and 2024 up or down in phase (i.e. together) over time to keep alignment with the desired sample pulse.

The initial software alignment is desirable to ensure the correct sample pulse is locked onto for each channel. This is because it would be possible for the hardware alignment, if the current phase position is between sample pulses, to lock different channels onto different adjacent sample pulses (i.e. one channel could move positive phase while the other could move negative phase). The software alignment ensures that the clocks are aligned before the hardware alignment is enabled.

Stage 4: Normal Operation

At this stage, the or each channel is correctly aligned internally, and each channel is aligned with the SYNCH CLOCK (leading to inter-channel alignment).

As will be appreciated, the above methodology employs the PIs and phase detectors to synchronise/align the operations of system 2000, and potentially that of four (or any number of) such systems (as in FIG. 7) relative to REFCLK and SYNC CLOCK, and also to adapt to any time delays between the sampler 2060 and the multiplexer 2072/2074 circuitry within the individual systems 2000 (ADC circuits).

An advantage of this technique is that there is no need for high-speed signals between ADC circuits or time-critical reset signals. Further, the control is deterministic; a single adjustment can be made at the phase interpolators 2022 and 2024 under digital control.

Additionally, there is no need for analogue phase-adjust signals and as such no related noise problems. Any analogue signals at the signal speeds disclosed herein are prone to circuit errors (e.g. due to mismatches) or interference (e.g. due to crosstalk from other clocks or noise pickup). It would be difficult to make the initial decision process completely reliable across multiple channels with analogue connections between them, for example to ensure that the alignment is not thrown out during operation by some kind of noise or glitch.

Figure 10:
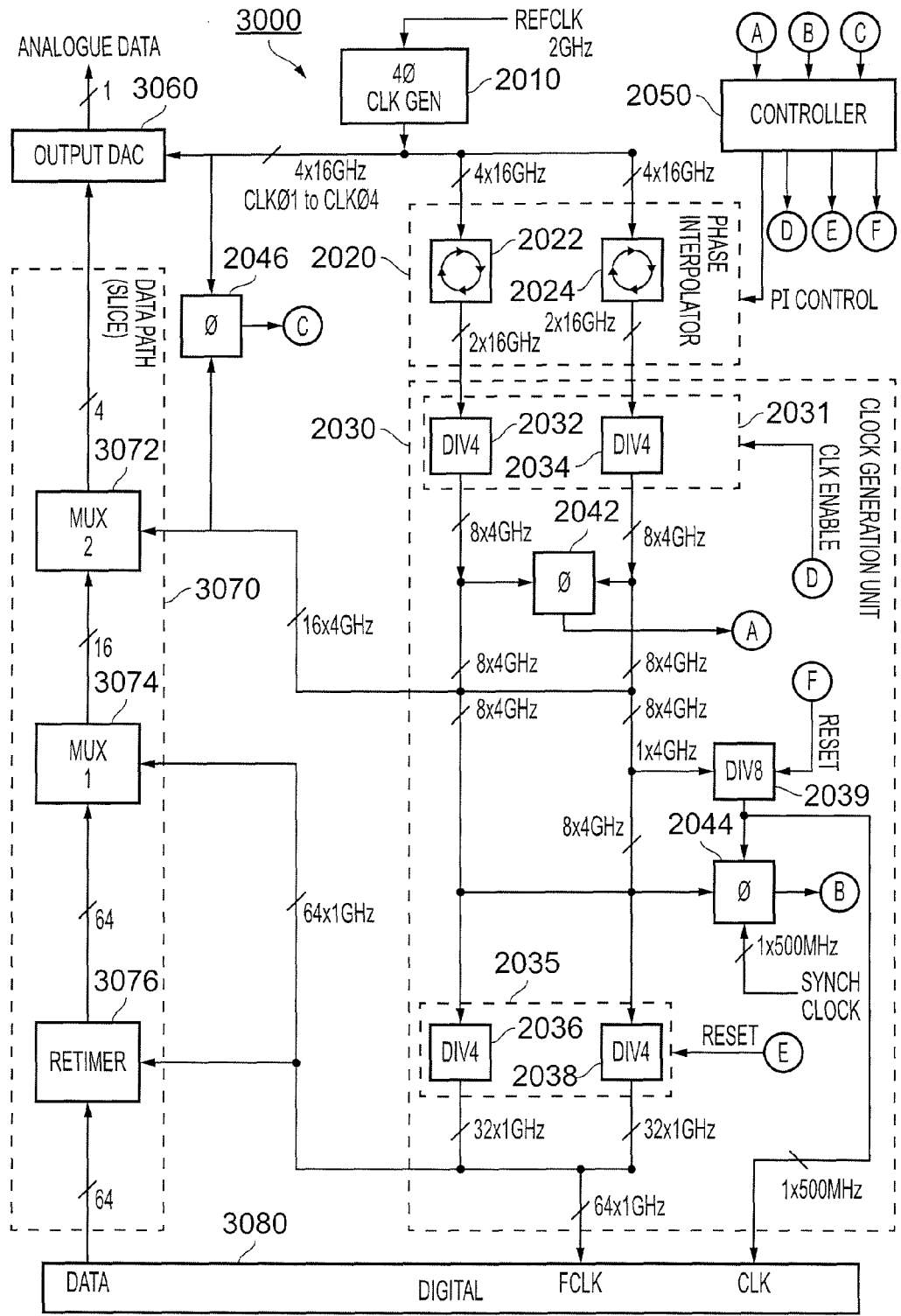
FIG. 10 is a schematic diagram of another system embodying the present invention.

FIG. 10 is a schematic diagram of a system 3000 embodying the present invention. As will become apparent, system 3000 has the functionality of a digital-to-analogue converter (or at least one slice thereof), and corresponds to the DAC circuitry 200 and clock generation and distribution circuitry 300 of FIG. 1. One DAC channel is shown in FIG. 10, although it is understood that others may be present on the same chip, in line with FIG. 7. Indeed, it will be appreciated that substantial parts of the system 3000 are similar to corresponding parts of the system 2000, and as such that a single chip as in FIG. 7 might comprise a combination/mixture of ADC and DAC circuits.

System 3000 comprises a clock generator A 2010, phase-rotation circuitry 2020, a clock generator B 2030, phase-detection circuitry (elements of which are identified in FIG. 9 as discussed below), control circuitry 2050, clock-controlled circuitry A 3060 and clock-controlled circuitry B 3070, and these correspond to the equivalent elements in FIG. 8 (and as such are denoted with similar/identical reference numerals).

Those elements that are denoted with the same reference numerals as in FIG. 9 are configured in the same or a similar way as in FIG. 9 and duplicate description is omitted. The main differences between FIGS. 9 and 10 are focussed on, as follows.

The clock-controlled circuitry A 3060 is connected to receive the input clock signals CLK ϕ1 to CLK ϕ4 and operable to function under the control of those clock signals. Here, the clock-controlled circuitry A 3060 is indicated as being an output DAC, and its circuitry corresponds to the switching circuitry 210 and 500 described above.

The clock-controlled circuitry B 3070 is a data path (carrying streams of data signals output from the digital unit 3080 and input to the clock-controlled circuitry A 3060) connected to receive the derived clock signals, i.e. the 4 GHz and 1 GHz clock signals mentioned above, and operable to function under the control of those clock signals.

As indicated in FIG. 10, the clock-controlled circuitry B 3070 has 2-stages of multiplexing shown as 3072 and 3074, and a retiming stage 3076. These correspond respectively to the 2-stages of multiplexing 220 and 230 and the retiming stage 240 of FIG. 1. The retiming stage 3076 receives 64 parallel 1GHz data signals from the digital unit 3080 and retimes and outputs them to the MUX1 3074, which multiplexes them and outputs 16 parallel 4 GHz data signals to the MUX2 3072, which in turn multiplexes them and outputs 4 parallel 16 GHz data signals to the output DAC 3060. The MUX2 3072 receives the 16 4 GHz clock signals output by the divider unit 2031, and the MUX1 3074 and the retimer 3076 receive the 64 1 GHz clock signals output by the divider unit 2035. This is also in line with FIG. 1, and analogous with FIG. 9.

Figure 1:
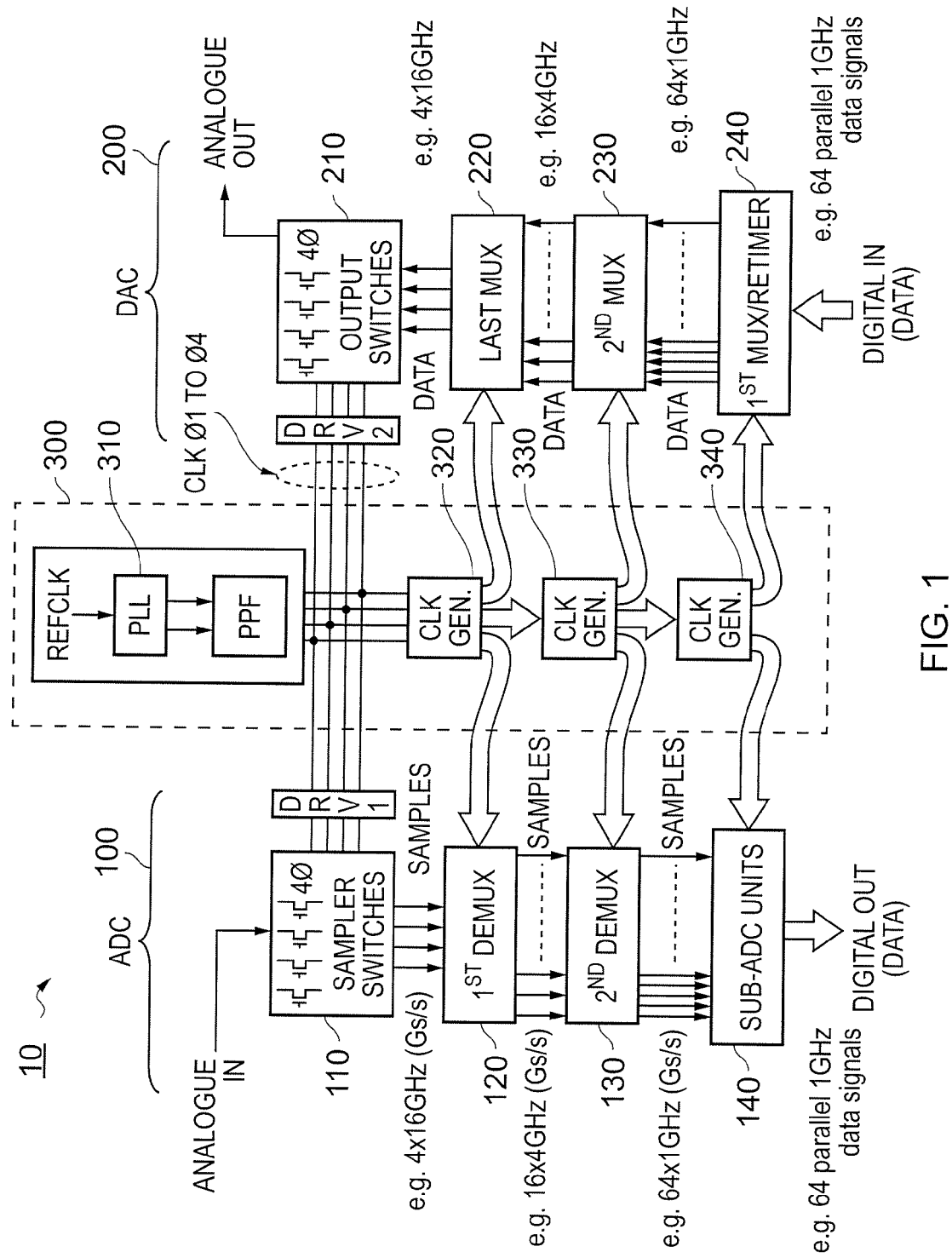

The clock-controlled circuitry A and B 3060 and 3070 are considered to handle data signals (in digital form, e.g. as 8-bit values, or in analogue form, e.g. as current pulses), and may represent a single slice of an overall DAC in line with the description of FIG. 1 above.

The phase-detection circuitry of system 3000 comprises a first phase detector 2042, a second phase detector 2044 and a third phase detector 2046, as in FIG. 9.

The methodology adopted in system 3000 is also generally the same as in system 2000, and consequently need not be explained again in full detail. The following is simply for clarity.

Stage 1: Internal Channel Clock Alignment

Firstly, the clock generator A 2010 is enabled to supply the 4-phase 16 GHz signals to the clock-controlled circuitry A (output DAC) 3060 and phase-rotation circuitry (phase interpolators, PIs) 2020.

At this stage, both PIs 2022 and 2024 are at digital control code 0 (i.e. applying zero phase rotation). The two DIV4 dividers 2032 and 2034 that are driven by the phase interpolators 2022 and 2024, respectively, are also enabled and running at this stage. However, the DIV4 divider outputs which drive the MUX2 3072 and the 8×DIV4 dividers (shown for convenience as dividers 2036 and 2038) in the divider unit 2035 are not enabled yet, as at this stage the two DIV4 dividers 2032 and 2034 are not assumed to be aligned in the correct phase.

The first phase detector 2042 (a 4 GHz phase detector) is used to tell if the two DIV4 dividers 2032 and 2034 are in correct alignment, and outputs a result of the phase detection (PHASE DETECT (4 GHz)) to the control circuitry (controller) 2050 via path A as above.

If the two DIV4 dividers 2032 and 2034 are not in correct alignment, the control circuitry 2050 causes the phase-rotation circuitry 2020 to issue a control signal (PI CONTROL) to the phase-rotation circuitry 2020 to cause a single PI 2022 or 2024 to apply full phase rotations to place the 16-phase 4 GHz output clock signals in the correct order. Full rotation is from code 0 through all of the codes back to code 0—this maintains the correct phase relationship of the PI outputs relative to one another after a full rotation.

When the first phase detector 2042 (4 GHz phase detector) indicates that the two DIV4 dividers 2032 and 2034 are in correct alignment, the 16-phase 4 GHz clock outputs are then enabled with the CLK ENABLE signal via path D. This enable signal is timed onto the 16 phases such that the 16-phase 4 GHz clocks start in a known order.

The following 8×DIV4 dividers (shown for convenience as dividers 2036 and 2038) in the divider unit 2035 and the DIV8 divider 2039 are then reset to a known starting position by way of RESET signals via paths E and F, and (as mentioned above) the clocks to them are started in a known order. As such, the phase relationship of all of the 64-phase 1 GHz clocks and the 500 MHz clock are known and in the correct phase relationship.

At this point, all of the clock relationships are known within the single channel represented by system 3000. Where multiple such channels (of system 3000 or mixtures of systems 2000 and 3000) are provided on a single chip, it is assumed that the above steps are carried out per channel.

At this point, however, channel-to-channel alignment is not known (see Stage 2) and alignment of the MUX2 3072 to OUTPUT DAC 3060 per channel is also not known (see Stage 3).

Stage 2: Channel-To-Channel Alignment

From Stage 1, alignment of all clock relationships are in the correct order within a single channel, such as the channel represented by system 3000. For synchronisation of multiple channels with one another, a single SYNCH CLOCK (500

MHz) as mentioned above is distributed to each channel such that for each channel the SYNC CLOCK is effectively identical. Such a SYNCH CLOCK could also be supplied to a channel as represented by system 3000 synchronise/align its operation simply with that signal.

The second phase detector 2044 (a 500 MHz phase detector) is then used to align the channels one to another (PHASE DETECT (500 MHz)), or each to the SYNCH CLOCK signal. The second phase detector 2044 outputs a result of the phase detection (PHASE DETECT (500 MHz)) to the control circuitry (controller) 2050 via path B as above.

In this case, the control circuitry 2050 causes the phase-rotation circuitry 2020 to issue a control signal (PI CONTROL) to the phase-rotation circuitry 2020 to cause both PIs 2022 and 2024 to be rotated together (within each channel) to align the 500 MHz clock signal output by the DIV8 divider 2039 with the distributed SYNCH CLOCK. Fine phase steps (e.g. down to single code steps) are used to give close alignment to the SYNC CLOCK. Both PIs 2022 and 2024 will have the same code (as they are rotated together) to keep the required quadrature.

At this point, each channel has a known phase relationship to the other channels, or particularly, to the SYNCH CLOCK. The OUTPUT DAC clocks (4-phase 16 GHz) are assumed to be well aligned between the channels due to the carefully distributed REFCLK (see FIG. 7) via a clock tree. The MUX2/MUX1 3072 and 3074 and DIV8 (500 MHz) 2039 are also aligned between channels.

However, alignment between the operation of the MUX2 3072 and the OUTPUT DAC 3060 is still to be accomplished.

Stage 3: OUTPUT DAC to MUX2 Alignment

As mentioned above, there may be switching or other delays in clock-controlled circuitry A 3060 (OUTPUT DAC) and/or clock-controlled circuitry B 3070 (MUX2 etc.), and thus it is beneficial to adjust operation of those circuits relative to one another to account for any such delays and enable them to handle data signals together as desired.

OUTPUT DAC to MUX2 alignment is accomplished by fine rotations of both PIs 2022 and 2024 together.

In the present system 3000, a hardware aligner comprising the third phase detector 2046 is enabled to keep alignment of each channel to a given pulse, as in FIG. 9.

Stage 4: Normal Operation

At this stage, the or each channel is correctly aligned internally, and each channel is aligned with the SYNCH CLOCK (leading to inter-channel alignment).

It will appreciated that the procedure described in connection with FIG. 9 focuses mainly on system 2000 and that the procedure described in connection with FIG. 10 focuses mainly on system 3000. Nevertheless, the stages of both procedures correspond to one another, and it will be appreciated that the two procedures could be run effectively in parallel when mixtures of system 2000 (ADC) and 3000 (DAC) are employed together in line with FIG. 7.

In effect, the procedures and systems take advantage of trusted REFCLK and SYNCH CLOCK signals, a clock tree, and sampler/output DAC circuitry and use phase interpolators and simple phase detectors to digitally bring the systems into working synchronisation, regardless of how many channels (DAC or ADC) have to be synchronised, and without needing any high-speed analogue or digital signals to connect between the channels. This means that multiple ADC/DAC circuits (as in systems 2000/3000) could be spread out across a chip and accurately synchronised, with no additional signal distribution except the REFCLK and SYNCH CLOCK signals, of which the REFCLK is needed anyway for the ADC/DAC circuits to function.

Incidentally, the signal frequencies and sampling rates shown in FIGS. 9 and 10, and the division factors of the dividers, are for consistency with FIG. 1 and thus the ease of understanding of the present invention. Naturally, other frequencies, rates and division factors could be employed dependent on the system requirements, e.g. of the clock-controlled circuitry 2060 and 2070, and 3060 and 3070.

Figure 2:
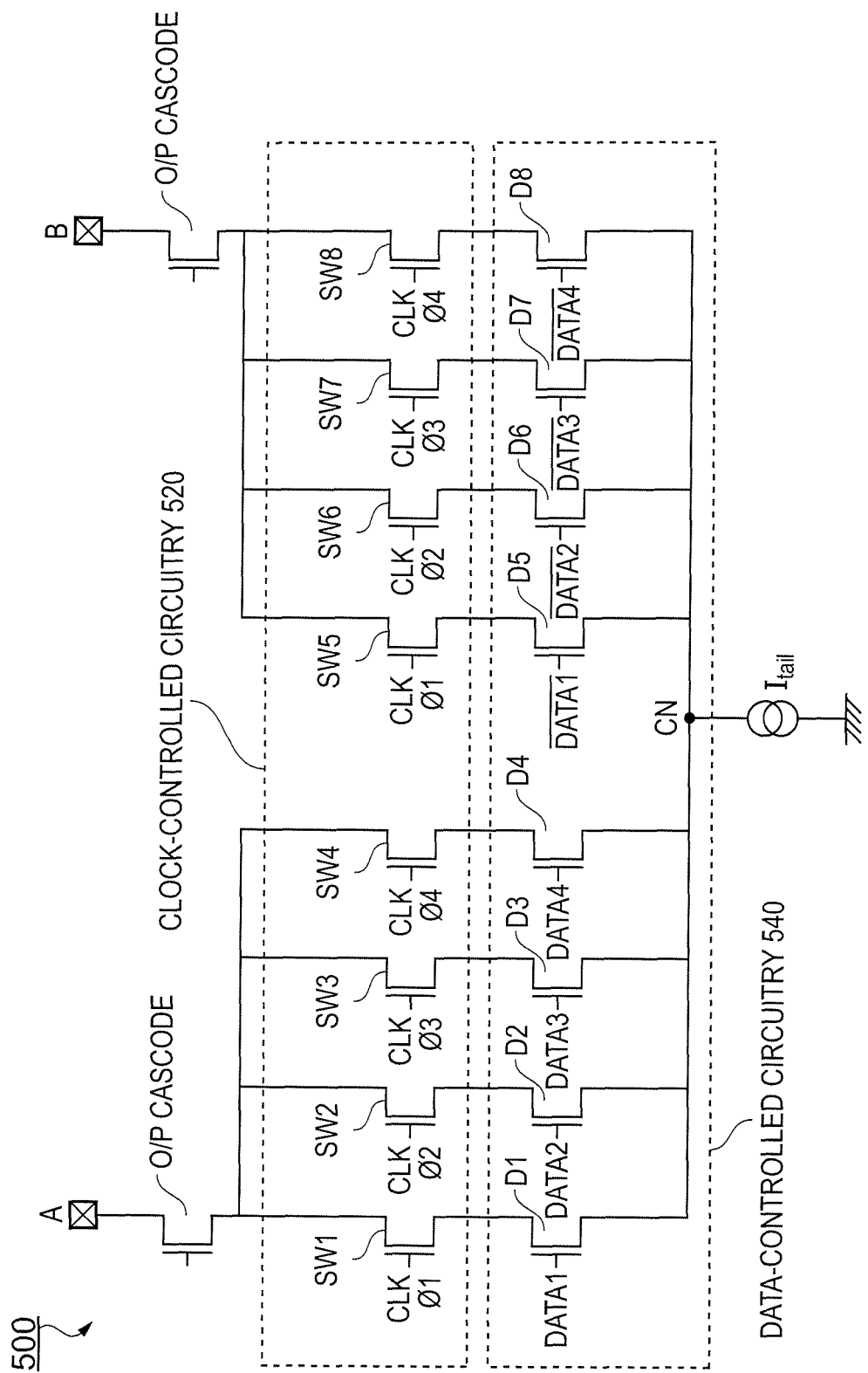

The phase detector 2046 in FIG. 10 might be implemented by way of circuitry similar to that in Output DAC 3060. As will be appreciated from FIG. 2, within Output DAC 3060 the data changes at the trough of the clocks CLK ϕ1 to CLK ϕ4 so it has no effect on the output current at this point. If, however, the phases of the clocks in a "phase detector" version of this circuitry were reversed, then the data would change at the peak of the clock and this would "chop" the current pulse in half (current switching from one output to the other). This splitting could then be used as a phase detection mechanism which exactly matches the delays in the "normal" Output DAC 3060 output stage, with the clock signals input to the DEMUX1 2072 used effectively as data signals, given that a correct phase relationship should lead to even splitting of currents.

Figure 5:
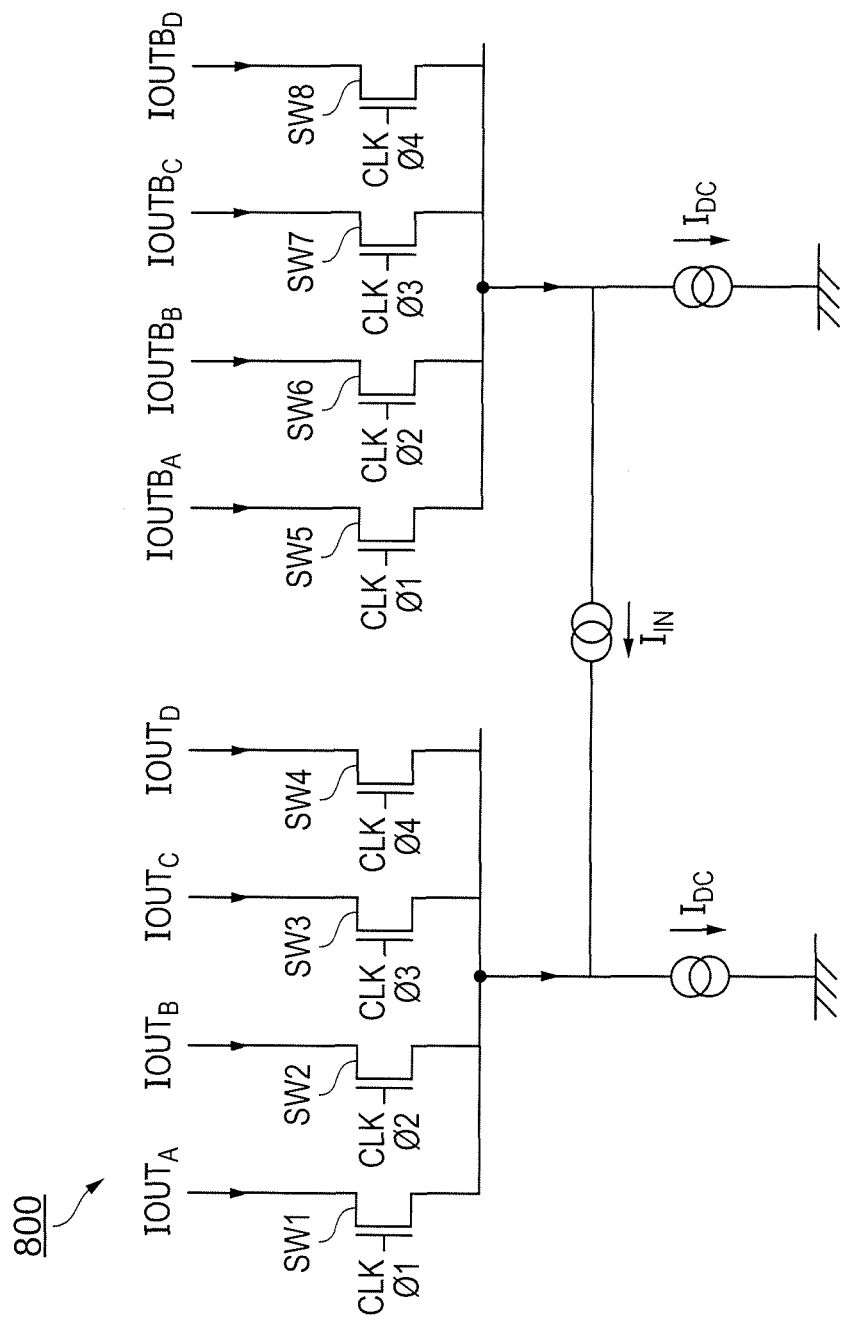
Figure 6:
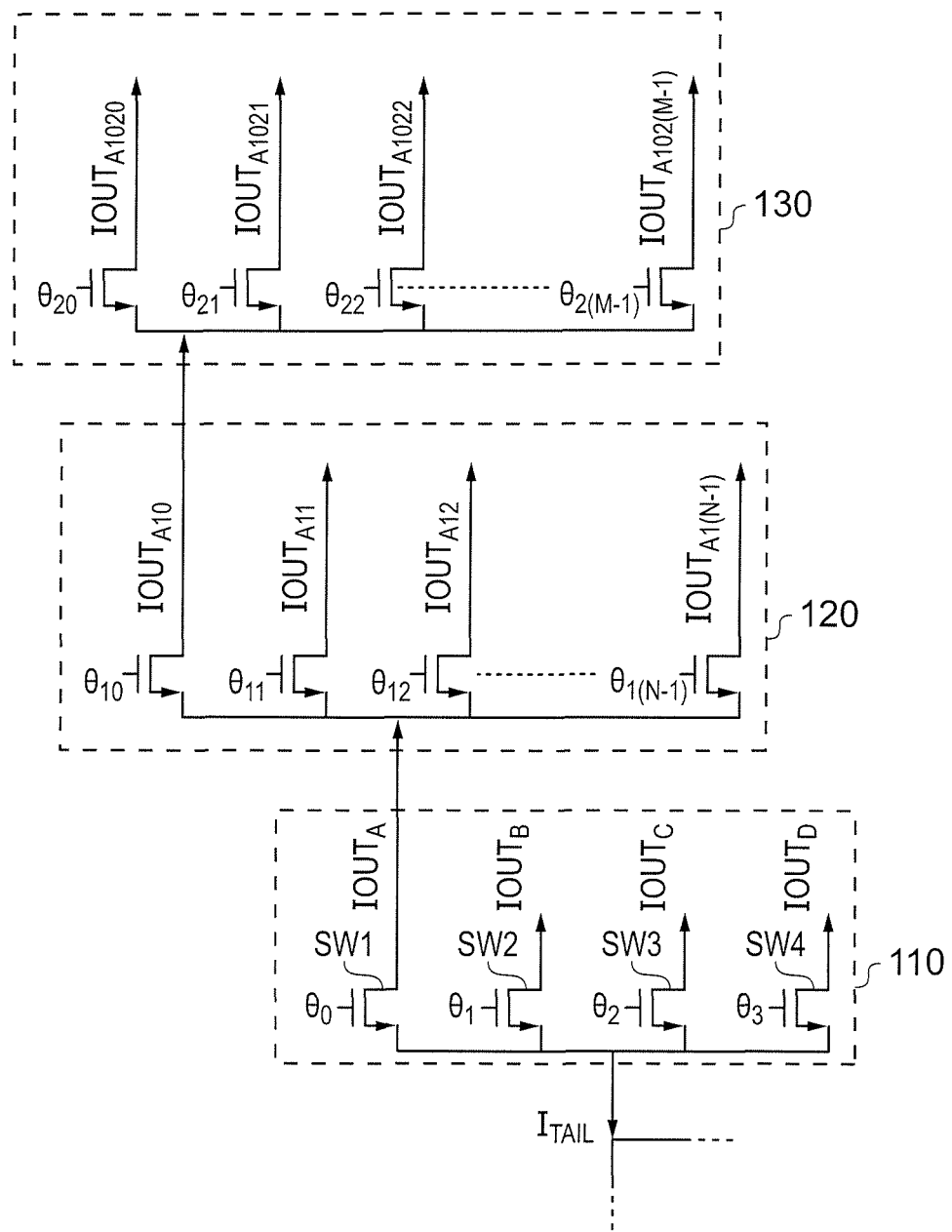

It will be appreciated that a similar technique could be employed in the phase detector 2046 in FIG. 9, i.e. by employing circuitry similar to that in Sampler 2060 as in FIG. 5 but with a constant current input, and by employing successive stages of switches controlled by combinations of the clock signals input to the DEMUX1 2072, to split the output currents and then check that those output currents have been split evenly.

Figure 11:
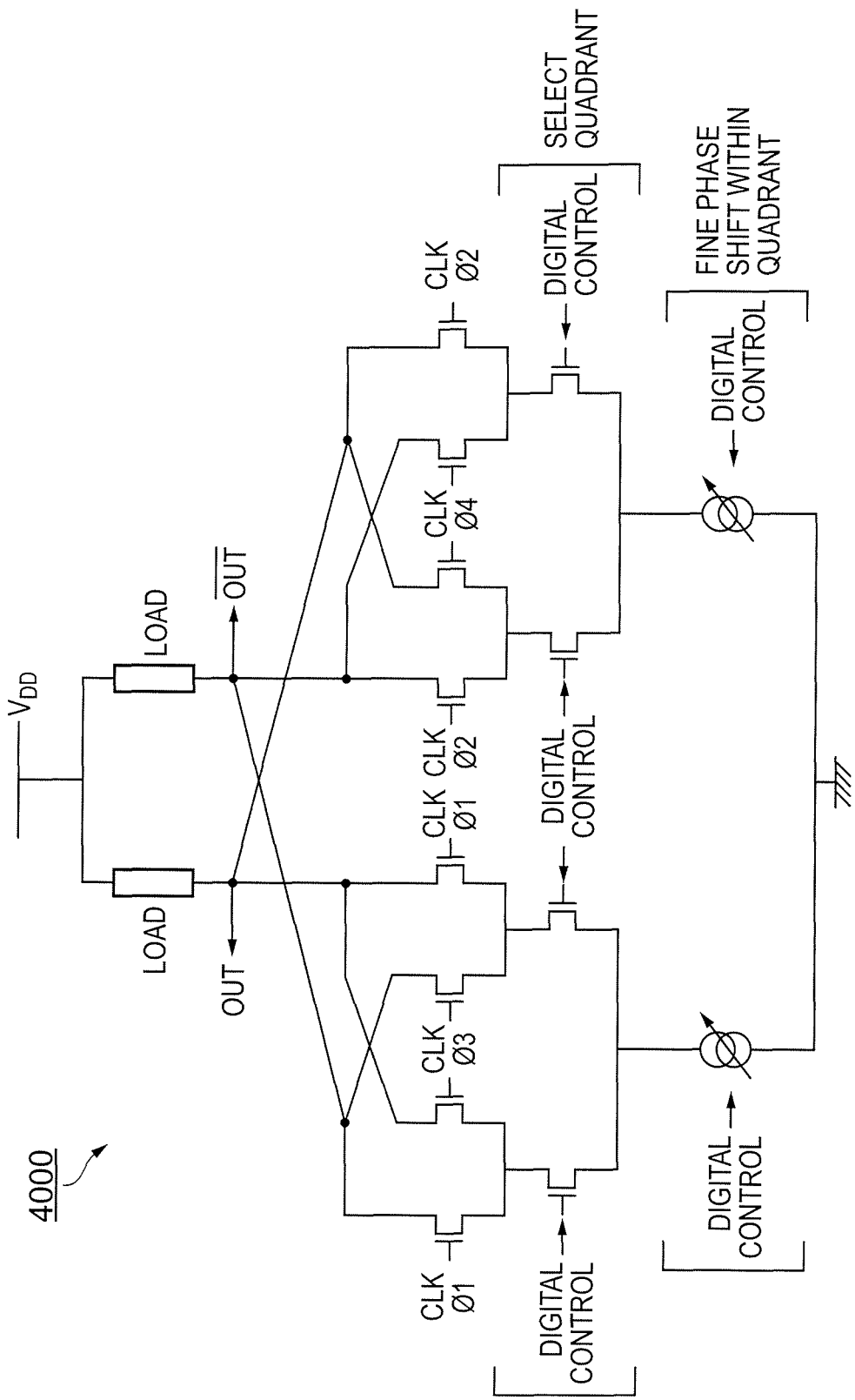
FIG. 11 is a schematic diagram presenting an example implementation of one of the phase interpolators of FIGS. 9 and 10.

FIG. 11 is a schematic diagram presenting an example implementation 4000 of one of the phase interpolators 2022, 2024 of FIGS. 9 and 10. As can be seen, the circuitry 4000 takes in all four clock phases CLK ϕ1 to CLK ϕ4. Based on digital control to the four transistors (switches) as indicated, i.e. controlling which are on and which are off, a quadrant of interest is selected, and by digital control of the variable current sources as indicated, fine phase shift within the selected quadrant is achieved. The output signals, generically indicated as OUT and /OUT, correspond to the two output clocks of the interpolator concerned, i.e. which are substantially in antiphase.

The digital control could be based on an input digital code, the codes sweeping e.g. through 64 values to effect full rotation (in line with the description above). As indicated earlier, the clock inputs CLK ϕ1 to CLK ϕ4 of one of phase interpolators 2022, 2024 may be 90° phase shifted relative to those of the other phase interpolator, so that the same digital code supplied to both phase interpolators gives overall quadrature output clocks (as desired).

Figure 12:
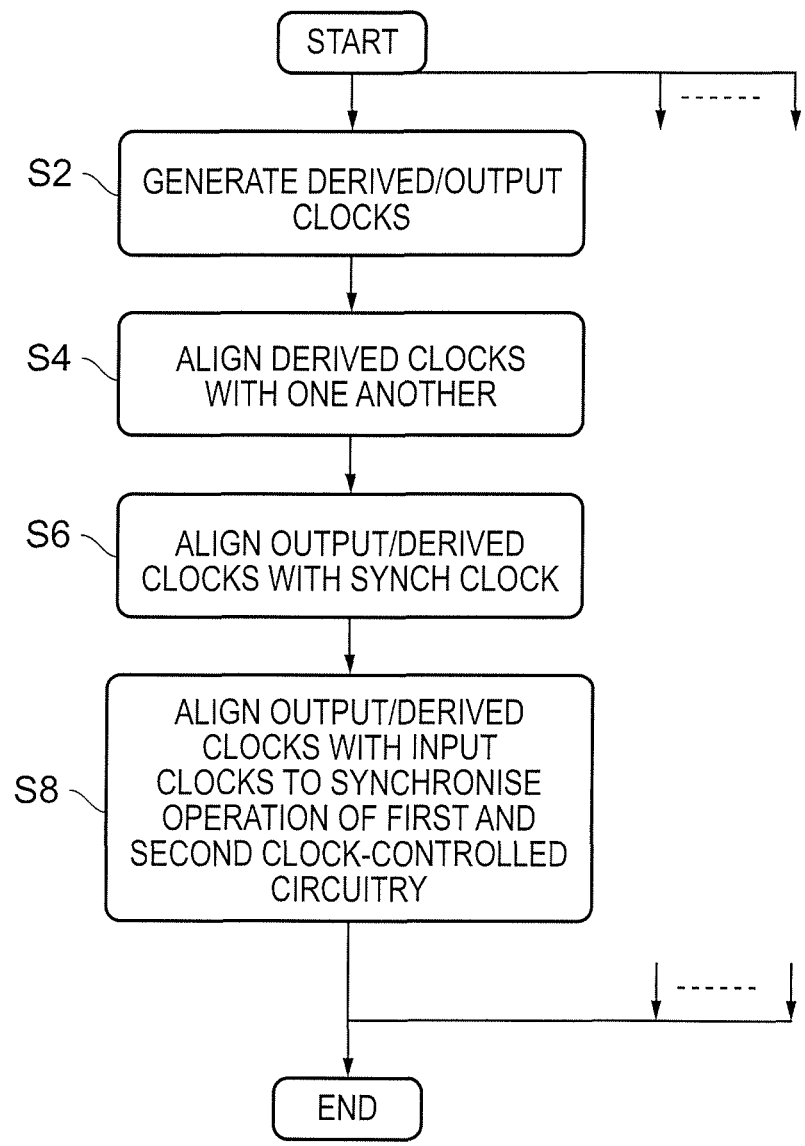
FIG. 12 is a flow diagram schematically representing a method embodying the present invention.

FIG. 12 is a flow diagram schematically representing a method embodying the present invention. The method comprises steps S2, S4, S6 and S8, per channel. Thus, it is indicated in FIG. 12 that the method could be carried out multiple times in parallel, if there are multiple channels.

In step S2 the output and derived clock signals are generated, and in step S4 the derived clock signals are aligned with one another. This corresponds to Stage 1 as described in connection with FIGS. 9 and 10.

In step S6, the output and/or derived clock signals are aligned with the SYNCH CLOCK, and this corresponds to Stage 2 as described in connection with FIGS. 9 and 10.

In step S8, the output and/or derived clock signals are aligned with the input clocks in order to synchronise operation of the first and second clock-controlled circuitry.

Step S8 (perhaps with step S6) may be repeated during operation of the channel concerned. The SYNCH CLOCK may be the same for all channels concerned. Depending on the relevant importance of steps S6 and S8, they may be performed in the opposite order or in parallel.

Circuitry of the present invention may from part of an analogue-to-digital converter, or a digital-to-analogue converter, or a system comprising one or more of both (including combinations of both). Circuitry of the present invention may be implemented as integrated circuitry, for example on an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many other different forms, within the scope of the appended claims.

The invention claimed is:

1. Signal-alignment circuitry, comprising:
    phase-rotation circuitry connected to receive one or more input clock signals each having a phase and operable to generate therefrom a plurality of output clock signals each having a phase, the phase-rotation circuitry being capable of causing the phases of said output clock signals to rotate by full rotations;
    divider circuitry connected to output derived clock signals each having a phase by division of corresponding said output signals; and
    control circuitry configured to control the amount of phase rotation applied by the phase-rotation circuitry to carry out a plurality of alignment operations, the alignment operations comprising:
    one or more first operations each comprising causing the phase of one or more of said output clock signals to rotate relative to the phase of one or more of the other said output clock signals, so as to bring derived clock signals towards or into a given phase relationship; and
    one or more second operations each comprising causing the phases of all of said output clock signals to rotate together, so as to bring said output or derived clock signals and said one or more input clock signals or an external-reference signal towards or into a given phase relationship.

2. Signal-alignment circuitry as claimed in claim 1, wherein said first operations comprise causing the phase of one or more of the output clock signals to rotate relative to the phase of the or each other said output clock signal by an integer number of full rotations, so that a phase relationship between the output clock signals is the same after each full rotation.

3. Signal-alignment circuitry as claimed in claim 1, wherein:
    the phase-rotation circuitry comprises a plurality of phase rotators, each operable to generate one or more said output clock signals based on said one or more input clock signals; and
    said first operations comprise controlling the amount of phase rotation applied by each of the phase rotators.

4. Signal-alignment circuitry as claimed in claim 1, wherein said first operations comprise causing the phase of one or more of the output clock signals to rotate relative to the phase of one or more other said output clock signals by an integer number of full rotations to adjust a phase relationship between said derived signals,
    optionally wherein the derived clock signals are generated by at least first and second dividers of the divider circuitry, each receiving different said output clock signals.

5. Signal-alignment circuitry as claimed in claim 1, wherein:
    said second operations comprise causing the phases of the output signals to rotate by a fractional amount of a full rotation; and/or
    said second operations comprise causing the phases of the output signals to rotate in a series of steps, where each step is smaller than 45 degrees, and preferably smaller than 15 degrees, and more preferably smaller than 6 degrees.

6. Signal-alignment circuitry as claimed in claim 1, wherein the circuitry comprises phase-detection circuitry operable to detect phase differences between at least pairs of said clock signals, and wherein said control circuitry is operable to carry out said operations in dependence upon one or more phase differences detected by the phase-detection circuitry.

7. Signal-alignment circuitry as claimed in claim 6, wherein:
    the phase-detection circuitry comprises a derived-signal phase detector operable to detect phase differences between at least first and second said derived clock signals; and
    the control circuitry is operable to carry out one or more of the first operations in dependence upon a phase difference detected by the derived-signal phase detector.

8. Signal-alignment circuitry as claimed in claim 6, wherein:
    the phase-detection circuitry comprises an external-reference phase detector operable to detect phase differences between at least one said output or derived clock signal and the external-reference signal; and
    the control circuitry is operable to carry out one or more of the second operations in dependence upon a phase difference detected by the external-reference phase detector.

9. Signal-alignment circuitry as claimed in claim 1, wherein:
    the phase-detection circuitry comprises an input-output phase detector operable to detect phase differences between at least one said output or derived clock signal and at least one said input clock signal; and
    the control circuitry is operable to carry out one or more of the second operations in dependence upon a phase difference detected by the input-output phase detector.

10. Signal-alignment circuitry as claimed in claim 1, wherein:
    the phase-rotation circuitry is configured to operate based on a digital input; and
    the control circuitry is operable to provide the digital input to the phase-rotation circuitry to digitally control the amount of applied phase rotation.

11. Signal-alignment circuitry as claimed in claim 1, wherein:
    the control circuitry is operable to carry out the first operations before the second operations; and/or
    the control circuitry is operable to carry out second operations to bring said output or derived clock signals and said external-reference signal towards or into a given phase relationship before carrying out other second operations to bring said output or derived clock signals and said one or more input clock signals towards or into a given phase relationship.

12. Data-handling circuitry, comprising:
    signal-alignment circuitry as claimed in claim 1;
    first clock-controlled circuitry configured to handle data based on at least one said input clock signal; and
    second clock-controlled circuitry configured to handle data based on at least one said output or derived clock signal.

13. Data-handling circuitry as claimed in claim 12, wherein the data-handling circuitry is digital-to-analogue converter circuitry or analogue-to-digital converter circuitry, operable to convert the handled data between digital and analogue forms.

14. A system comprising:
a plurality of sets of signal-alignment circuitry as claimed in claim 1,
wherein the external-reference signal is the same for each said set of signal-alignment circuitry, and
wherein the sets of circuitry are configured to optionally carry out their first and second operations in parallel with one another.

15. An integrated circuit chip comprising signal-alignment circuitry as claimed in claim 1.

16. A system comprising a plurality of sets of data-handling circuitry as claimed in claim 12, wherein the external-reference signal is the same for each said set, and
wherein the sets of circuitry are configured to optionally carry out their first and second operations in parallel with one another.

17. An integrated circuit chip comprising data-handling circuitry as claimed in claim 12.

18. An integrated circuit chip comprising a system as claimed in claim 14.

19. Signal-alignment circuitry, comprising:
phase-rotation circuitry connected to receive one or more input clock signals each having a phase and operable to generate therefrom a plurality of output clock signals each having a phase; and
control circuitry operable to control the amount of phase rotation applied by the phase-rotation circuitry to carry out a plurality of alignment operations, the alignment operations comprising:
one or more first operations each comprising causing the phase of one or more of said output clock signals to rotate relative to the phase of one or more of the other said output clock signals, so as to bring said output clock signals, or derived clock signals derived therefrom, towards or into a given phase relationship; and
one or more second operations each comprising causing the phases of all of said output clock signals to rotate together, so as to bring said output or derived clock signals and said one or more input clock signals or an external-reference signal towards or into a given phase relationship,
wherein said first operations comprise causing the phase of one or more of the output clock signals to rotate relative to the phase of the or each other said output clock signal by an integer number of full rotations, so that a phase relationship between the output clock signals is the same after each full rotation.

20. Signal-alignment circuitry, comprising:
phase-rotation circuitry connected to receive one or more input clock signals each having a phase and operable to generate therefrom a plurality of output clock signals each having a phase; and
control circuitry operable to control the amount of phase rotation applied by the phase-rotation circuitry to carry out a plurality of alignment operations, the alignment operations comprising:
one or more first operations each comprising causing the phase of one or more of said output clock signals to rotate relative to the phase of one or more of the other said output clock signals, so as to bring said output clock signals, or derived clock signals derived therefrom, towards or into a given phase relationship; and
one or more second operations each comprising causing the phases of all of said output clock signals to rotate together, so as to bring said output or derived clock signals and said one or more input clock signals or an external-reference signal towards or into a given phase relationship,
wherein:
the phase-rotation circuitry comprises a plurality of phase rotators, each operable to generate one or more said output clock signals based on said one or more input clock signals; and
said first operations comprise controlling the amount of phase rotation applied by each of the phase rotators.

21. Signal-alignment circuitry, comprising:
phase-rotation circuitry connected to receive one or more input clock signals each having a phase and operable to generate therefrom a plurality of output clock signals each having a phase; and
control circuitry operable to control the amount of phase rotation applied by the phase-rotation circuitry to carry out a plurality of alignment operations, the alignment operations comprising:
one or more first operations each comprising causing the phase of one or more of said output clock signals to rotate relative to the phase of one or more of the other said output clock signals, so as to bring said output clock signals, or derived clock signals derived therefrom, towards or into a given phase relationship; and
one or more second operations each comprising causing the phases of all of said output clock signals to rotate together, so as to bring said output or derived clock signals and said one or more input clock signals or an external-reference signal towards or into a given phase relationship,
wherein:
the control circuitry is operable to carry out the first operations before the second operations; and
the control circuitry is operable to carry out second operations to bring said output or derived clock signals and said external-reference signal towards or into a given phase relationship before carrying out other second operations to bring said output or derived clock signals and said one or more input clock signals towards or into a given phase relationship.

* * * * *